(12) United States Patent
Kim et al.

(10) Patent No.: US 10,665,926 B2
(45) Date of Patent: May 26, 2020

(54) MOBILE TERMINAL

(71) Applicant: LG ELECTRONICS INC., Seoul (KR)

(72) Inventors: Dongjin Kim, Seoul (KR); Moonsoo Song, Seoul (KR); Namyong Kim, Seoul (KR); Byungeun Jeon, Seoul (KR); Kyoungsun Hwang, Seoul (KR); Changil Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 126 days.

(21) Appl. No.: 15/762,974

(22) PCT Filed: Mar. 22, 2016

(86) PCT No.: PCT/KR2016/002883
§ 371 (c)(1),
(2) Date: Mar. 23, 2018

(87) PCT Pub. No.: WO2017/052015
PCT Pub. Date: Mar. 30, 2017

(65) Prior Publication Data
US 2018/0287246 A1 Oct. 4, 2018

(30) Foreign Application Priority Data
Sep. 25, 2015 (KR) .................. 10-2015-0137121

(51) Int. Cl.
*H01Q 1/24* (2006.01)
*H01Q 5/378* (2015.01)
(Continued)

(52) U.S. Cl.
CPC .............. *H01Q 1/243* (2013.01); *H01Q 1/46* (2013.01); *H01Q 5/335* (2015.01); *H01Q 5/378* (2015.01);
(Continued)

(58) Field of Classification Search
CPC ........... H01Q 1/243; H01Q 1/46; H01Q 1/24; H01Q 1/38; H01Q 1/48; H01Q 21/28;
(Continued)

(56) References Cited

U.S. PATENT DOCUMENTS 9,024,823 B2 * 5/2015 Bevelacqua ............. H01Q 9/42
343/702
9,041,606 B2 * 5/2015 Faraone ................. H01Q 13/10
343/702
(Continued)

FOREIGN PATENT DOCUMENTS

EP         2597724        5/2013
KR      20110008606       1/2011
(Continued)

OTHER PUBLICATIONS

PCT International Application No. PCT/KR2016/002883, International Search Report dated Jun. 21, 2016, 2 pages.

*Primary Examiner* — Tho G Phan
(74) *Attorney, Agent, or Firm* — Lee, Hong, Degerman, Kang & Waimey

(57) ABSTRACT

The present invention relates to a mobile terminal which comprises: a display unit; a frame for supporting the display unit; a printed circuit board formed on one side of the frame; a case formed on one side of the printed circuit board; first and second beam-shaped metal members arranged on both sides of the frame while being spaced apart from the frame and exposed to the outside; and a first antenna which is formed adjacent to the frame and implements a first frequency band, wherein the first antenna comprises: a first radiator including at least one end of the first metal member or the second metal member; a first power supply unit for supplying power to the first radiator; and a first ground unit for grounding the first radiator.

20 Claims, 26 Drawing Sheets

(51) Int. Cl.
*H01Q 7/00* (2006.01)
*H01Q 5/335* (2015.01)
*H01Q 21/28* (2006.01)
*H01Q 9/42* (2006.01)
*H04M 1/02* (2006.01)
*H01Q 1/46* (2006.01)
*H03H 7/38* (2006.01)
*H05F 1/00* (2006.01)

(52) U.S. Cl.
CPC ............. *H01Q 7/00* (2013.01); *H01Q 9/42* (2013.01); *H01Q 21/28* (2013.01); *H04M 1/026* (2013.01); *H04M 1/0266* (2013.01); *H04M 1/0277* (2013.01); *H03H 7/38* (2013.01); *H05F 1/00* (2013.01)

(58) Field of Classification Search
CPC .......... H01Q 5/335; H01Q 5/378; H01Q 7/00; H01Q 9/42; H04M 1/0266; H04M 1/0277; H04M 1/02; H04M 1/026; H05F 1/00; H03H 7/38; H05K 5/00
See application file for complete search history.

(56) References Cited

U.S. PATENT DOCUMENTS

| 9,325,080 | B2* | 4/2016 | Ouyang | H01Q 21/30 |
| 10,200,092 | B1* | 2/2019 | Irci | H04B 5/02 |
| 10,389,857 | B2* | 8/2019 | Sun | H01Q 9/42 |

FOREIGN PATENT DOCUMENTS

| KR | 20120117048 | 10/2012 |
| KR | 1020120133368 | 12/2012 |
| KR | 20140037687 | 3/2014 |

* cited by examiner

MOBILE TERMINAL

CROSS-REFERENCE TO RELATED APPLICATIONS

This application is the National Stage filing under 35 U.S.C. 371 of International Application No. PCT/KR2016/002883, filed on Mar. 22, 2016, which claims the benefit of earlier filing date and right of priority to Korean Application No. 10-2015-0137121, filed on Sep. 25, 2015, the contents of which are all hereby incorporated by reference herein in their entirety.

TECHNICAL FIELD

The present disclosure relates to a mobile terminal in which a metal member provided on a side surface thereof is utilized as an antenna.

BACKGROUND ART

Terminals may be divided into a mobile terminal (mobile/portable terminal) and a stationary terminal according to whether the terminal may be moved. The mobile terminal may be divided into a handheld terminal and a vehicle mounted terminal according to whether the user may carry the mobile phone directly.

The functions of mobile terminals are diversified. For example, there are functions of data and voice communication, photographing and video shooting through a camera, voice recording, music file playback through a speaker system, and outputting an image or video to a display unit. Some terminals are equipped with an electronic game play function or a multimedia player function. In particular, modern mobile terminals may receive multicast signals that provide visual content such as broadcast, video or television programs.

As functions are diversified, terminals are implemented in the form of multimedia devices supporting composite functions such as photographing or video shooting, music or video file playback, playing games, receiving broadcast, and the like.

In order to support and enhance the functions of mobile terminals, improvement of structural parts and/or software parts of mobile terminals may be considered.

Meanwhile, in the case of the currently released metal phones which use a metal as an appearance, a metal member with a fixed design is mainly utilized as an antenna, lowering a degree of freedom of antenna design, and thus, improvement of antenna performance (bandwidth, radiation efficiency, degree of isolation, influence on the human body, etc.) is limited.

In order to solve the problem, if the entire mobile terminal is covered with a metal member, a slit must be applied to design an antenna, which is disadvantageous in that an appearance design is damaged. In addition, in the case of terminals employing a side slit, a death grip phenomenon may occur, and if the slit is located at upper and lower ends, a size of a radiator may be reduced to limit antenna bandwidth and efficiency improvement.

DISCLOSURE

Technical Problem

The present disclosure is directed to solving the above-mentioned problems and other problems. Another object of the present disclosure is to provide a mobile terminal which utilizes a metal member provided on a side outer edge of a mobile terminal as a radiator of an antenna.

Technical Solution

According to an aspect of the present disclosure, there is provided a mobile terminal including: a display unit; a frame supporting the display unit; a printed circuit board (PCB) formed on one surface of the frame; a case formed on one surface of the PCB, first and second metal members disposed to be spaced apart from the frame on both sides of the frame, having a beam shape, and exposed to the outside; and a first antenna formed to be adjacent to the frame and implementing a first frequency band, wherein the first antenna includes a first radiator including at least one end of the first metal member or the second metal member; a first power feeder feeding power to the first radiator; and a first grounding part grounding the first radiator.

According to one aspect of the present disclosure, the first antenna may further include: a varying part provided on the case, formed between the first power feeder and the first radiator, and varying a resonance frequency in the first frequency band.

According to one aspect of the present disclosure, the first power feeder may include: a first power feeding terminal formed on the PCB and electrically connected to one point of the varying part; and a second power feeding terminal electrically connected to the varying part at one end and electrically connected to the first radiator at the other end.

According to one aspect of the present disclosure, the varying part may include at least one conductive member, and when the conductive member is two or more, the conductive members may be spaced apart from each other and fed through an indirect power feeding scheme.

According to one aspect of the present disclosure, the conductive member may include an open stub which is directly fed or indirectly fed.

According to one aspect of the present disclosure, the first or second metal member may be grounded by a plurality of contact pins, and the plurality of contact pins may be formed in a direction away from the first power feeder based on the first grounding part and may be spaced apart from each other at an interval smaller than ¼ times a wavelength ($\lambda_1$) corresponding to a center frequency (f1) of the first frequency band.

According to one aspect of the present disclosure, the contact pin may include a first contact pin electrically connecting the first or second metal member to the PCB.

According to one aspect of the present disclosure, the contact pin may include a second contact pin electrically connecting the first or second metal member to the frame.

According to one aspect of the present disclosure, a fastening portion coupled to the frame may be provided at an end of the first radiator, and an extending pattern portion may be formed in the fastening portion.

According to one aspect of the present disclosure, an anti-electric shock device may be connected to at least one of the first power feeder, the first grounding part, and the contact pin.

According to one aspect of the present disclosure, the first contact pin may be in contact with an upper surface or a lower surface of the PCB.

According to one aspect of the present disclosure, when the first contact pin is in contact with the lower surface of the PCB, a portion of the frame may be cut away such that the PCB protrudes outwards, relative to the frame.

According to one aspect of the present disclosure, the first antenna may be formed at an upper end of the first metal member, a second antenna implementing a second frequency band different from the frequency band of the first antenna may be provided at an upper end of the second metal member, and the second antenna may include: a second radiator including an upper end of the second metal member and implementing the second frequency band; a second power feeder feeding power to the second radiator; and a second grounding part grounding the second radiator.

According to one aspect of the present disclosure, the second metal member may be grounded by a plurality of contact pins, and the plurality of contact pins may be formed in a direction away from the second power feeder based on the second grounding part and may be spaced apart from each other at an interval smaller than ¼ times a wavelength ($\lambda_2$) corresponding to a center frequency (f2) of the second frequency band.

According to one aspect of the present disclosure, a third antenna implementing a third frequency band may be provided at a lower end of the second metal member, and the third antenna may include: a third radiator including the lower end of the second metal member and implementing a third frequency band; a third power feeder feeding power to the third radiator; and a third grounding part grounding the third radiator.

According to one aspect of the present disclosure, the second metal member may be grounded by a plurality of contact pins, and the plurality of contact pins may be formed in a direction away from the third power feeder based on the third grounding part and may be spaced apart from each other at an interval smaller than ¼ times a wavelength ($\lambda_3$) corresponding to a center frequency (f2) of the third frequency band.

According to one aspect of the present disclosure, the mobile terminal may further include: a fourth antenna provided on an upper side of the frame, wherein the fourth antenna may include: a first pattern portion formed on an upper end surface of the frame; and a second pattern portion formed on the case, wherein the first and second pattern portions may be electrically connected and a fourth power feeder and a fourth grounding part may be formed on the first and second pattern portions.

According to one aspect of the present disclosure, the mobile terminal may further include: a fifth antenna provided on a lower side of the frame, wherein the fifth antenna may include: a third pattern portion formed on a lower end surface of the frame; and a fourth pattern portion formed on a speaker module disposed on the same plane as the case, wherein the third and fourth pattern portions may be electrically connected and a fifth feeder and a fifth grounding part may be formed on the third and fourth pattern portions.

According to one aspect of the present disclosure, the second antenna may further include: a varying part provided on the case, formed between the second power feeder and the second radiator, and varying a resonance frequency in a second frequency band.

According to one aspect of the present disclosure, the third antenna may further include: a varying part provided on the case, formed between the third power feeder and the third radiator, and varying a resonance frequency in a third frequency band.

Advantageous Effects

Effects of the mobile terminal and the control method according to the present disclosure will be described as follows.

According to at least one of the embodiments of the present disclosure, a guide for designing an antenna in the mobile terminal may be provided by utilizing the metal member provided on the side surface as a radiator of the antenna.

In addition, according to at least one of the embodiments of the present disclosure, it is possible to improve antenna performance using the metal member on the side edge by suggesting the varying part capable of increasing the degree of freedom of antenna design in the standardized structure.

Additional ranges of possibilities will become apparent from the following detailed description. It should be understood, however, that the detailed description and specific examples, such as the preferred embodiments of the invention, are given by way of illustration only, since various changes and modifications within the spirit and scope of the invention will be apparent to those skilled in the art.

BEST MODES

Figure 1A:
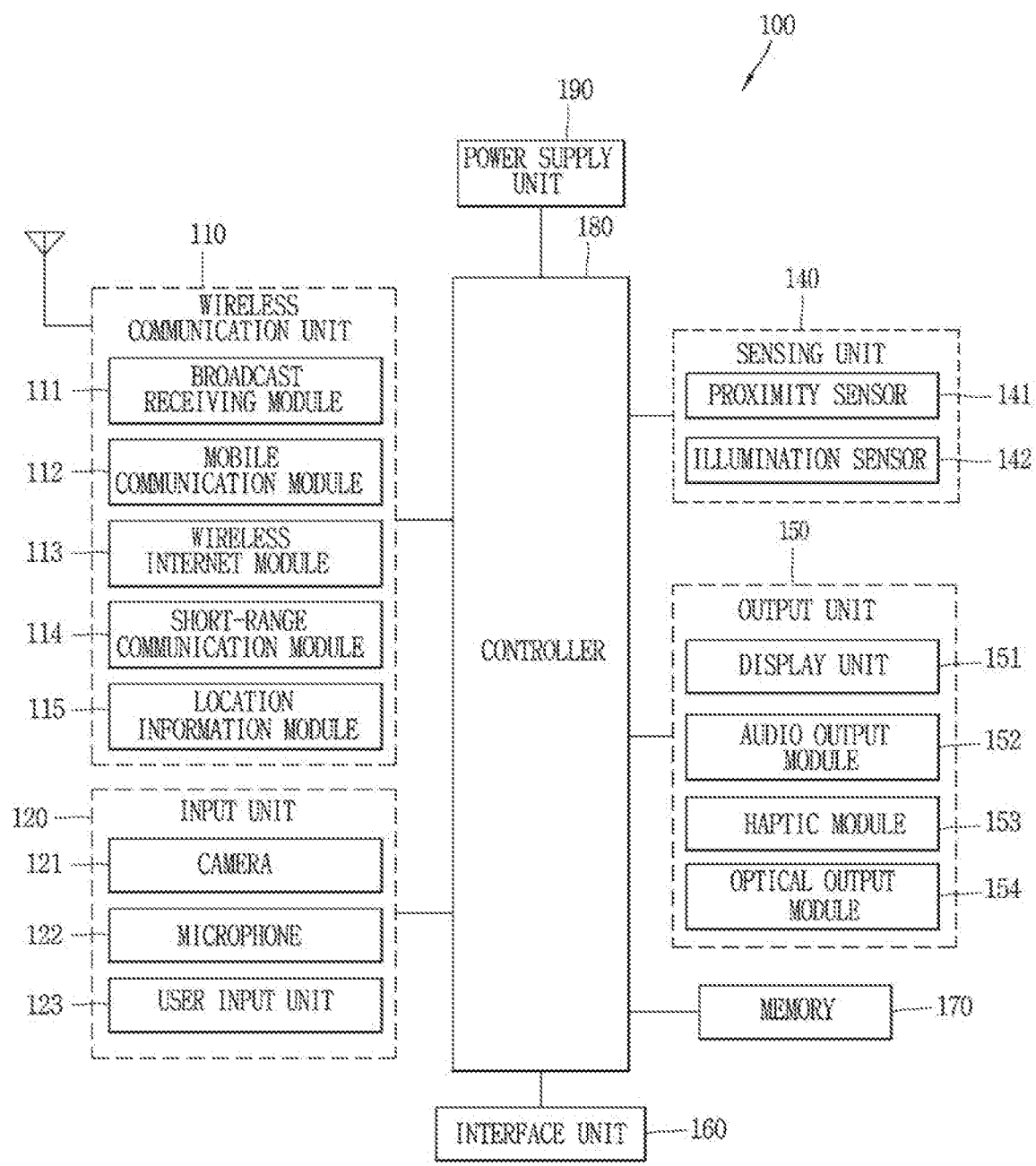
FIG. 1A is a block view illustrating a mobile terminal according to the present disclosure.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
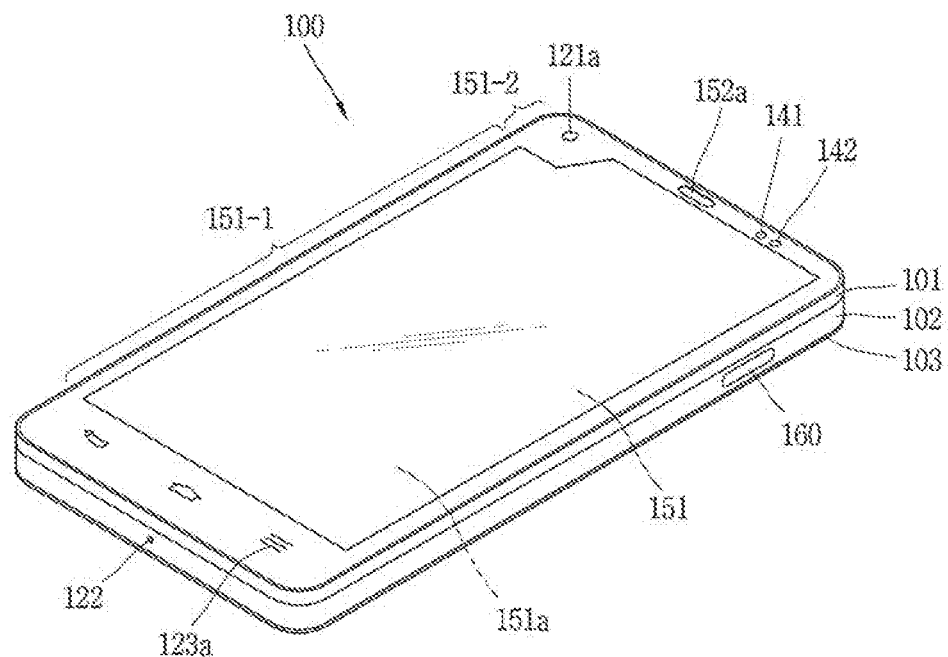
FIGS. 1B and 1C are conceptual views illustrating an example of a mobile terminal according to the present disclosure in different directions.
Figure 1C:
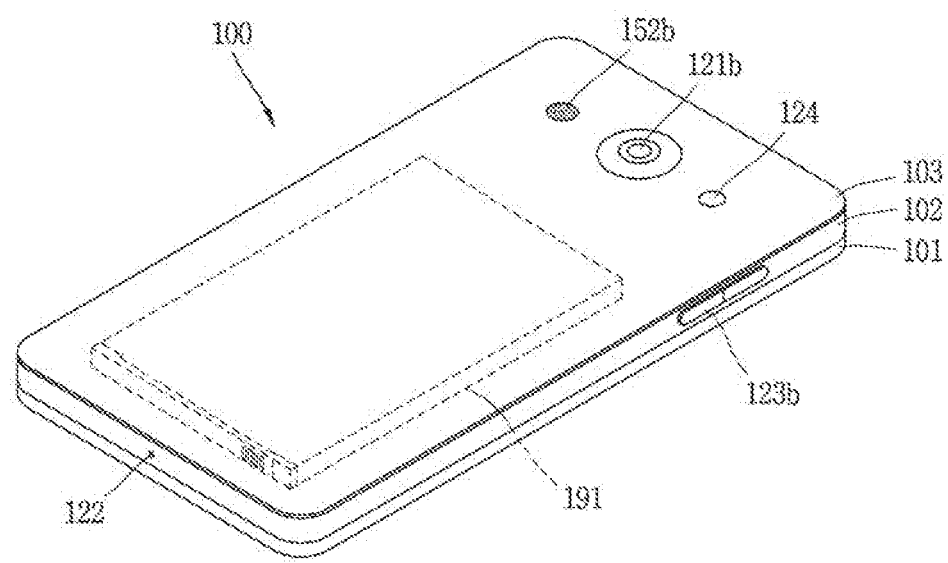

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server.

Further, the wireless communication unit 110 typically includes one or more modules which connect the mobile terminal 100 to one or more networks. To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142. If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output by the various components described above or activating application programs stored in the memory 170.

Also, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body or configured to be detachable from the terminal body.

At least some of the above components may operate in a cooperating manner, so as to implement an operation or a control method of a glass type terminal according to various embodiments to be explained later. The operation or the control method of the glass type terminal may be implemented on the glass type terminal by driving at least one application program stored in the memory 170.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like).

However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include the display unit 151, the first audio output module 152a, the second audio output module 152b, the proximity sensor 141, the illumination sensor 142, the optical output module 154, the first camera 121a, the second camera 121b, the first manipulation unit 123a, the second manipulation unit 123b, the microphone 122, the interface unit 160, etc.

Hereinafter, the mobile terminal 100 will be explained with reference to FIGS. 1B and 1C. The display unit 151, the first audio output module 152a, the proximity sensor 141, the illumination sensor 142, the optical output module 154, the first camera 121a and the first manipulation unit 123a are arranged on the front surface of the terminal body. The second manipulation unit 123b, the microphone 122 and the interface unit 160 are arranged on the side surfaces of the terminal body. The second audio output module 152b and the second camera 121b are arranged on the rear surface of the terminal body.

However, it is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 outputs information processed in the mobile terminal 100. For example, the display unit 151 may display information on an execution screen of an application program driven in the mobile terminal 100, or a User Interface (UI) or a Graphic User Interface (GUI) associated with such execution screen information.

The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output unit 152a may be implemented as a receiver for transmitting a call sound to a user's ears, and the second audio output unit 152b may be implemented as a loud speaker for outputting each type of alarm sounds or a play sound of multimedia.

It may be configured such that the sounds generated from the first audio output module 152a are released along an assembly gap between the structural bodies (e.g., between the window 151a and the front case 101). In this case, a hole independently formed to output audio sounds may not be seen or hidden in terms of appearance, thereby further simplifying the appearance of the mobile terminal 100.

The optical output module 154 can output a signal for indicating an event generation using light of a light source. Examples of events generated in the mobile terminal 100 may include message reception, call signal reception, a missed call, an alarm, a schedule notice, an email reception, information reception through an application, and the like. A signal output by the optical output module 154 may be implemented in such a manner that the mobile terminal emits monochromatic light or light with a plurality of colors. The signal output may be terminated as the mobile terminal senses that a user has checked the generated event, for example.

The first camera 121a processes image data of still pictures or video acquired by an image capture device in a video capturing mode or an image capturing mode. The processed image frames may be displayed on the display unit 151 or may be stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion and may employ any tactile method that allows the user to perform manipulation such as touch, push, scroll, or the like. The first and second manipulation units 123a and 123b may be implemented in a user's non-tactile manner, e.g., by a proximity touch, a hovering touch, etc.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 1C, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (refer to FIG. 1A) may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body. The battery 191 may receive power via a power source cable connected to the interface unit 160.

Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Hereinafter, exemplary embodiments related to a control method that may be implemented in the mobile terminal configured as described above will be described with reference to the accompanying drawings. It will be apparent to those skilled in the art that modifications and variations can be made without departing from the spirit and scope of the invention.

Also, in the present disclosure, the display unit 151 may be divided into two regions 151-1 and 151-2 in one direction. In this case, the plurality of display regions 151-1 and 151-2 may be independently controlled, and power consumption may be reduced by selectively activating only one of the two regions, if necessary.

For example, the first region 151-1 of the display unit 151 may occupy most of the front surface of the mobile terminal 100 as a main screen for outputting general image information. The second region 151-2 of the display unit 151 may be arranged abreast above the first region 151-1, as an auxiliary screen for displaying state information, or the like, of the mobile terminal 100.

The first region 151-1 and the second region 151-2 may be independently activated and deactivated. For example, when the user is not using the mobile terminal 100, the first region may be set to the OFF state and the second region is set to an ON state, so that a state of the terminal or basic information may be always checked even when the mobile terminal 100 is not in use.

In FIG. 1B, the second region 151-2 is located at an upper end of the first region 151-1. However, the present invention is not limited thereto and the second region 151-2 may be located at a lower end of the first region 151-1 or may be located at both upper and lower ends of the first region 151-1. In another example, the second region 151-2 may be located on one side or both sides of the first region 151-1.

Also, as illustrated in FIG. 1B, the camera modules 121a provided on the front side may be formed at a pair to shorten a time taken for operating a high dynamic range (HDR) function. The HDR function is a camera capturing technique for capturing a more realistic image by capturing several photographs having various brightness and performing correction by combining the photographs to one photograph. For example, by providing two front camera modules 121a, a time taken for photographing and correcting photographs with different brightness may be shortened. Here, one of the front camera modules 121a may be for photographing a general angle of view and the other may be for photographing a wide view, but the present disclosure is not limited thereto.

Figure 2:
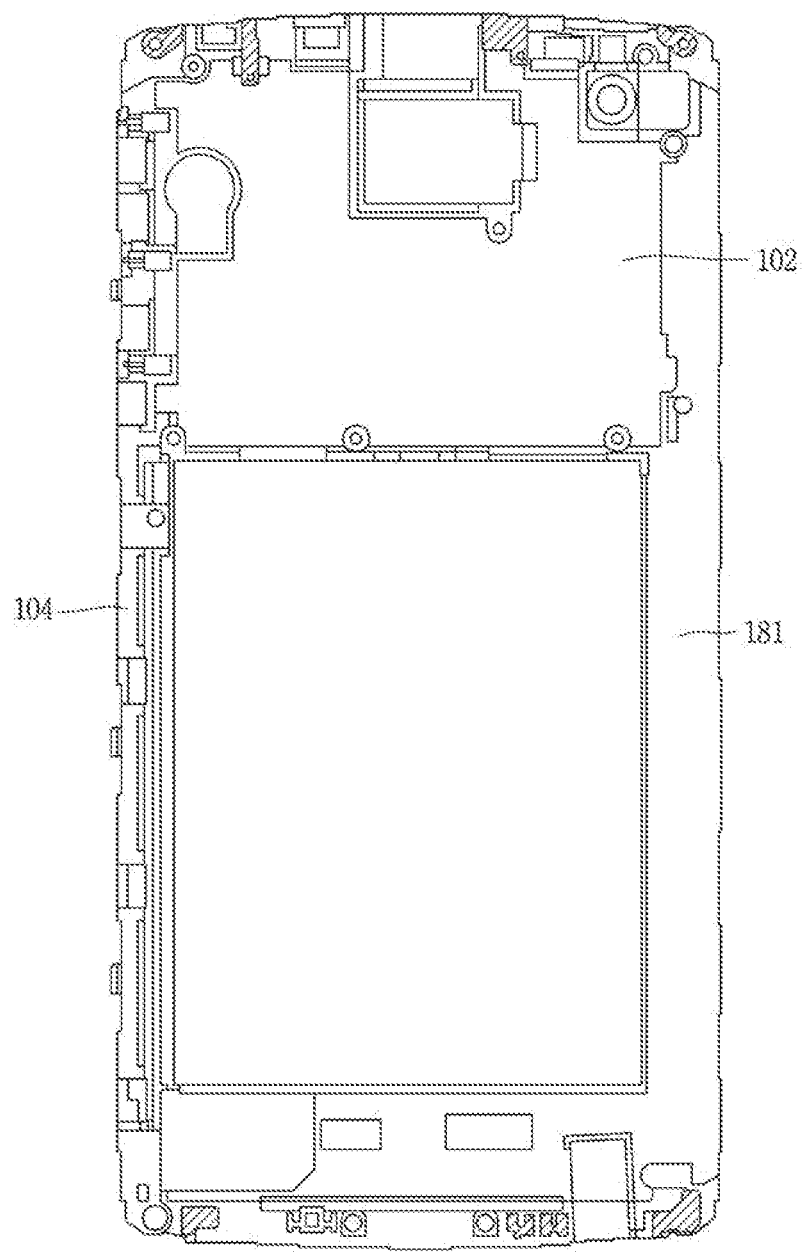
FIG. 2 is a rear view of a frame associated with the present disclosure.

FIG. 2 illustrates a rear view of a mobile terminal 100 in which a frame 104 related to the present disclosure is exposed.

The frame 104 may provide a space in which antennas to be located at upper and lower ends of the mobile terminal 100 is to be mounted and is not limited to a specific component name. Thus, the frame 104 may be the front case 101 (see FIG. 1B) described above.

The mobile terminal according to an embodiment of the present disclosure includes the display unit 151, the frame 104 supporting the display unit 151, a printed circuit board (PCB) 181 formed on the rear surface of the frame 104, the rear case 102 formed on a rear surface of the printed circuit board 181, and first and second metal members 105 and 106 disposed on both sides of the frame 104, spaced apart from the frame 104, exposed to the outside, and having a beam shape.

According to an embodiment of the present disclosure, the first and second metal members 105 and 106 may form an appearance of side surfaces of the mobile terminal 100, thereby achieving a fine appearance design.

Figure 3:
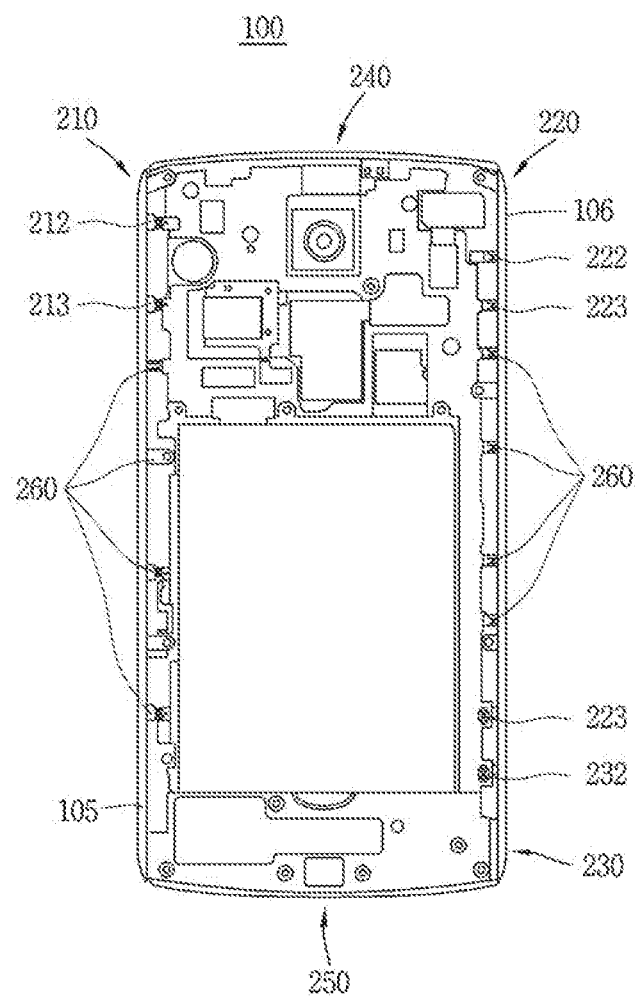
FIG. 3 is a rear view of a mobile terminal in which a frame is exposed according to an embodiment of the present disclosure.
Figure 4:
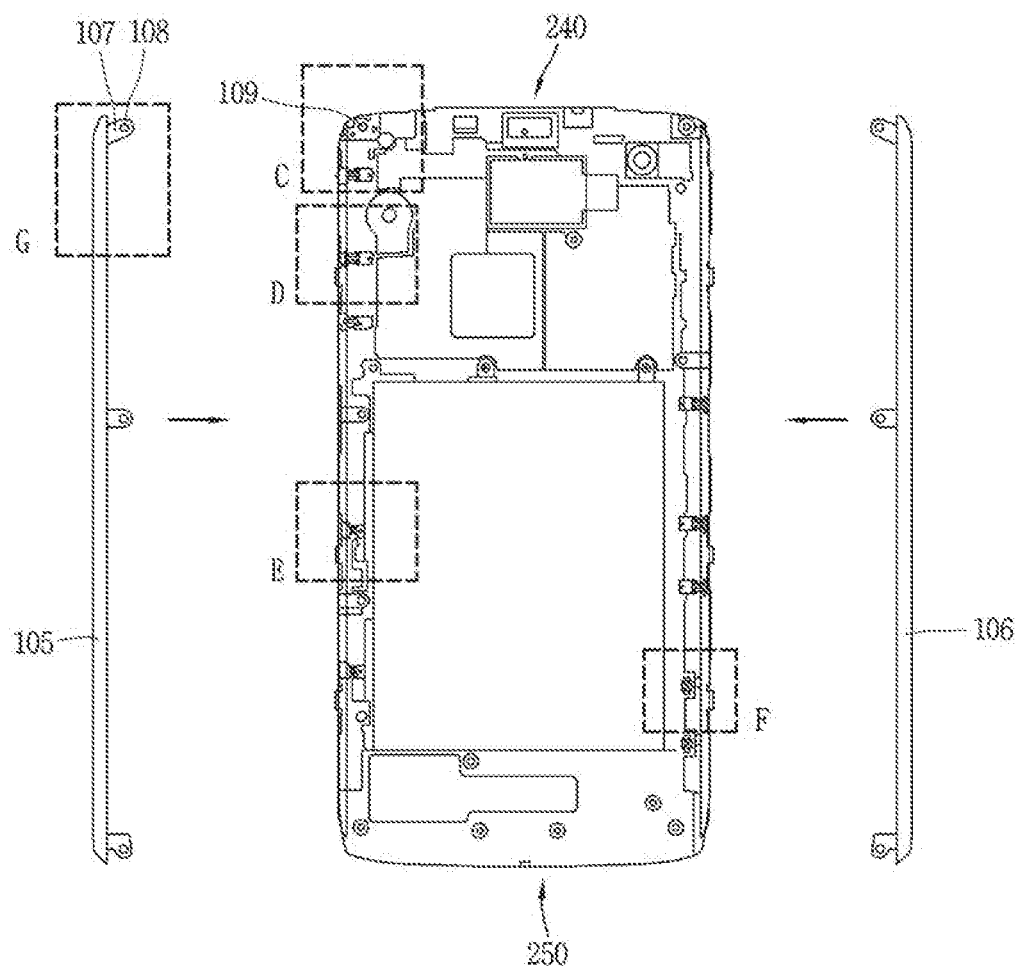
FIG. 4 is a rear view illustrating a state in which the first and second metal members are separated in FIG. 3.

FIG. 3 illustrates a rear surface of a mobile terminal in which a PCB and a frame are exposed according to an embodiment of the present disclosure. FIG. 4 is a rear view illustrating a state in which the first and second metal members 105 and 106 are separated. That is, FIGS. 3 and 4 are views illustrating an antenna formation position based on the metal members 105 and 106 and a state in which the metal members 105 and 106 are coupled to the frame 104 or the PCB 181 according to an embodiment of the present disclosure.

Figure 15:
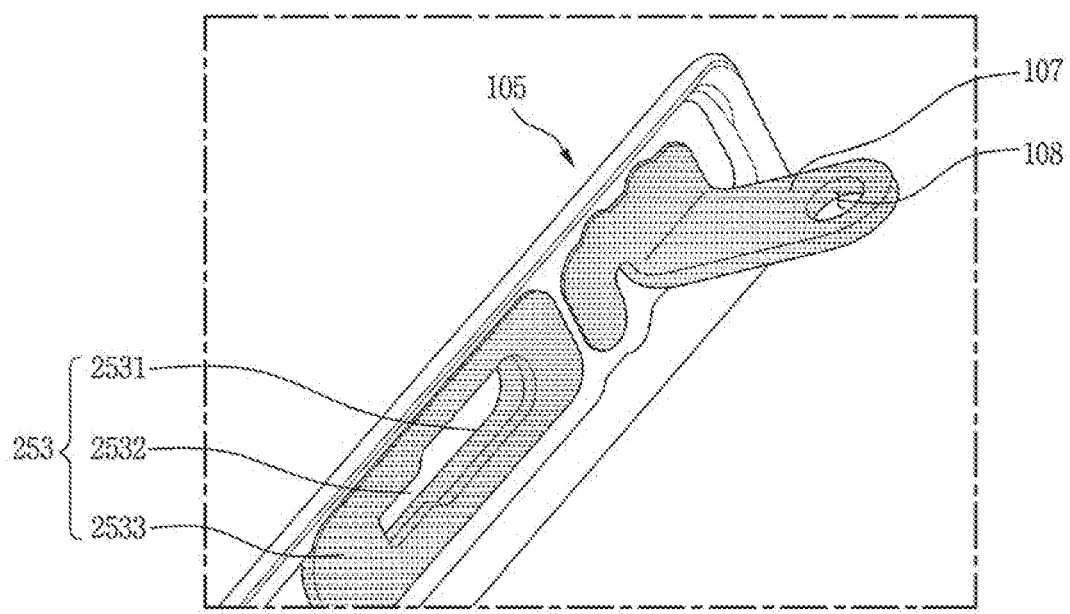
FIG. 15 is an enlarged perspective view of a region G in FIG. 4.
Figure 16:
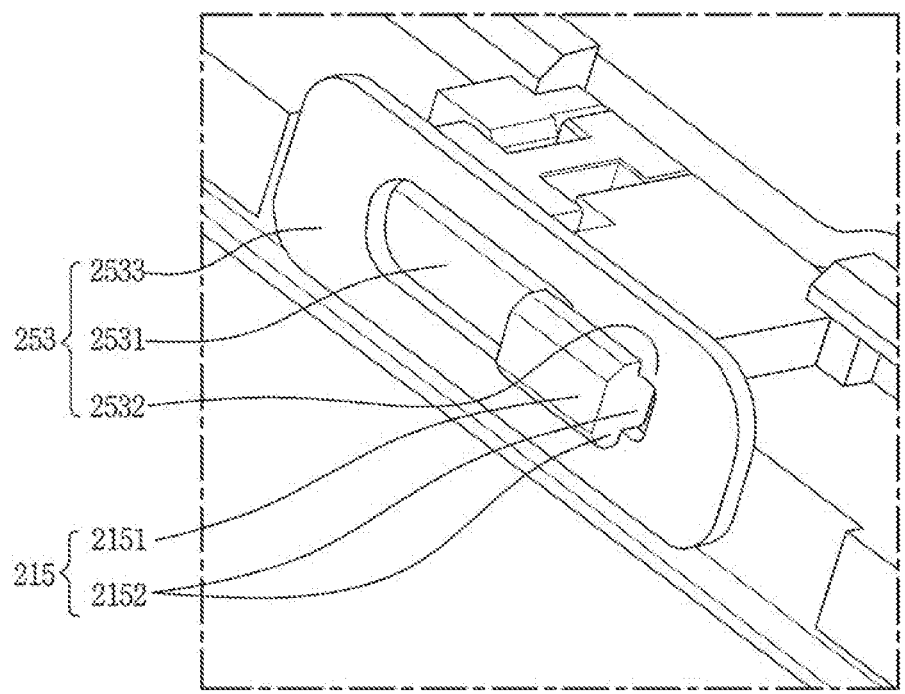
FIG. 16 is an embodiment in which a slide coupling hole is coupled to a region E of FIG. 4.

FIG. 15 is an enlarged perspective view of a region G of FIG. 4, and FIG. 16 illustrates an embodiment in which the slide coupling hole 253 is coupled to a region E of FIG. 4.

Referring to FIGS. 15 and 16, a slide coupling module may be used to stably couple the first and second metal members 105 and 106 and the frame 104. Hereinafter, the first metal member 105 will be described for the sake of convenience, but it may also be applied to the second metal member 106 as well. An inner surface of the first metal member 105 may be provided with a slide coupling hole 253. The slide coupling hole 253 may be divided into a first region 2531 having a wide hole and a second region 2532 having narrow hole. A hole forming member 2533 forming the slide coupling hole 253 may be coupled to the first metal member 105 by soldering.

A protruding hook portion 215 corresponding to the slide coupling hole 253 of the first metal member 105 may be provided on a side surface of the frame 104. The protruding hook portion 215 may have an escape preventing portion 2151 located on the outer side and a coupling portion 2152 located on the inner side.

A width of the escape preventing portion 2151 of the protruding hook portion 215 may correspond to a width of the first region 2531 of the slide coupling hole 253 and a width of the coupling portion 2152 of the protruding hook portion 215 may correspond to a width of the second region 2532 of the slide coupling hole 253. The first metal member 105 and the frame 104 may be stably coupled by sliding the first metal member 105 through the inner side surface of the frame 104.

Also, as illustrated in FIG. 15, a fastening hole 108 is formed in a fastening portion 107 and is fastened to a fastening hole 109 formed in the PCB 181 by a coupling member such as a bolt. The fastening portion 107 and the fastening hole 108 may be formed at a middle point between the upper and lower ends of the first and second metal members 105 and 106. The fastening portion 107 is fastened by a coupling member such as a bolt, so that the first and second metal members 105 and 106 form an outer appearance.

In an embodiment of the present disclosure, the first to third antennas 210, 220 and 230 are implemented using the first and second metal members 105 and 106. That is, the first and second metal members 105 and 106 are formed adjacent to the frame 104, and the first to third antennas 210, 220, and 230 that implement different frequency bands may be implemented by utilizing upper and lower ends as radiators.

In an embodiment of the present disclosure, for the sake of convenience, when viewed from the rear side of the mobile terminal, an antenna provided on the left upper end will be referred to as a first antenna 210, an antenna provided at a right upper end will be referred to as a second antenna 220, and an antenna provided at a right lower end will be referred to as a third antenna. The first to third antennas 210, 220, and 230 may be, for example, planar inverted-F antennas (PIFAs).

That is as illustrated in FIG. 3, the first antenna 210 is illustrated to be formed at the upper end of the first metal member 105, the second antenna 220 is illustrated to be formed at the upper end of the second metal member 106, and the third antenna 230 is illustrated to be formed at the lower end of the second metal member 106. However, no matter whether the first to third antennas 210, 220 and 230 are formed, the components include a radiator, a feeder, and a grounding part, respectively. Hereinafter, the first antenna 210 will be mainly described, and the second and third antennas 220 and 230 have the same configuration as that of the first antenna 210, unless otherwise mentioned. Also, since the first to third radiators 211, 221 and 231 of the first to third antennas 210, 220 and 230 are formed on portions of the first and second metal members 105 and 106, the first to third radiators 211, 221 and 231 and the first and second metal members 105 and 106 may be mixed to be used with each other.

Figure 5:
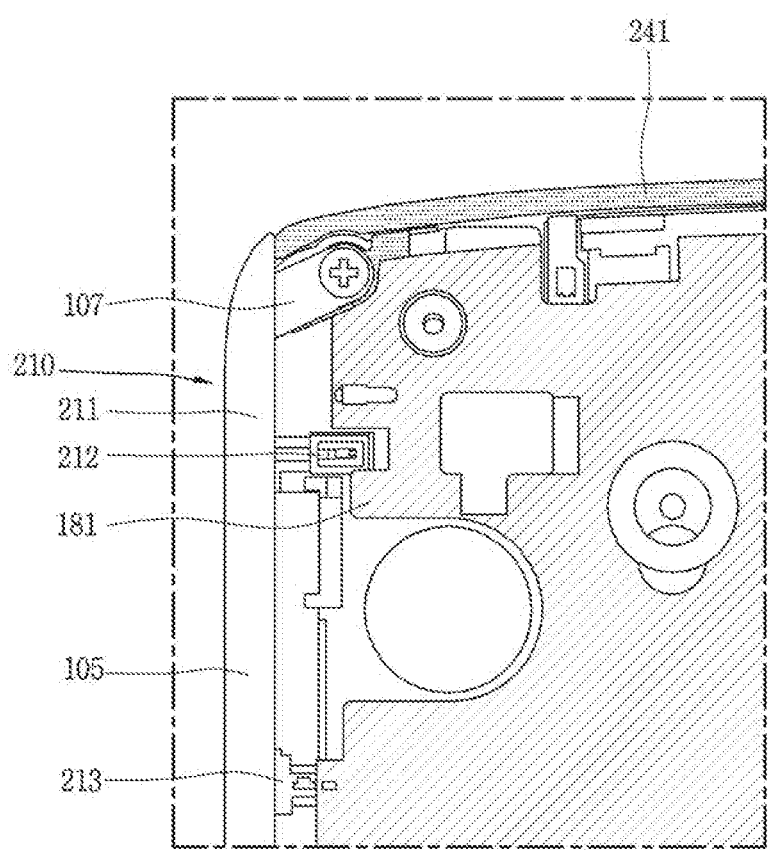
FIG. 5 is an enlarged view illustrating a state in which a first metal member is fastened to a portion C in FIG. 4.
Figure 6:
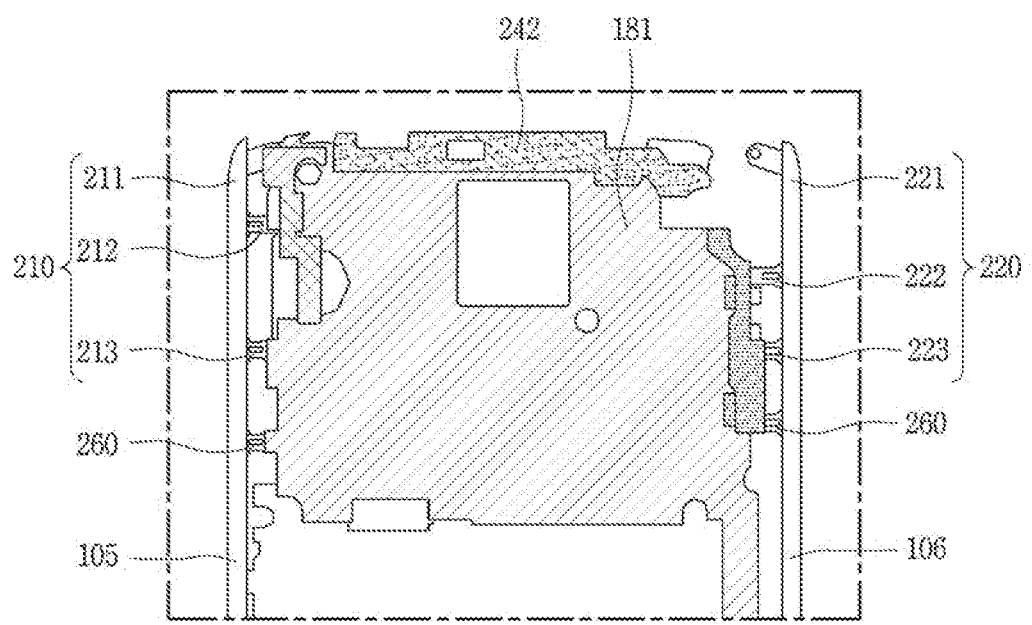
FIG. 6 is a rear view of a mobile terminal in which a printed circuit board is exposed according to an embodiment of the present disclosure.

FIG. 5 is an enlarged view illustrating a state in which the first metal member 105 is fastened to a portion C of FIG. 4. Referring to FIG. 5, the first antenna 210 includes a first radiator 211 including at least one end of the first metal member 105 and implementing a first frequency band, a first power feeder 212 feeding power to the first radiator 211, and a first grounding part 213 grounding the first radiator 211. In an embodiment of the present disclosure, since the first and second metal members 105 and 106 and the PCB 181 are spaced apart from each other to form a slot therebetween, the first to third antennas 210, 220, and 230 form slot antennas.

Figure 7A:
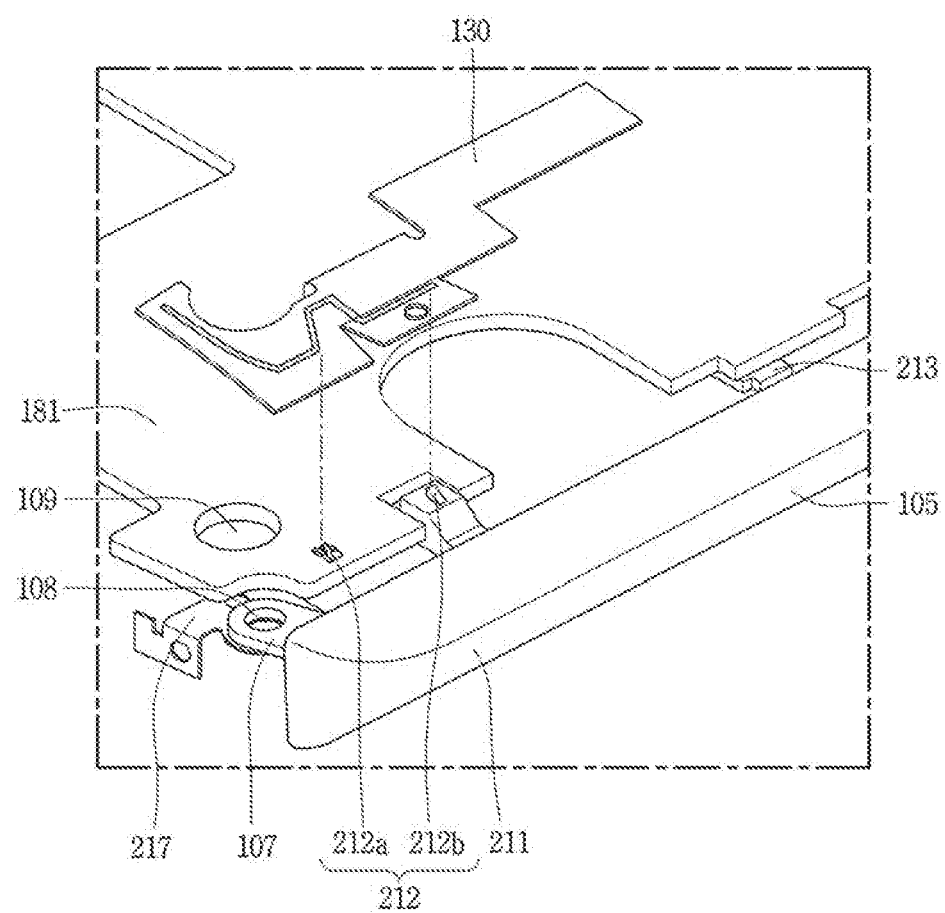
FIG. 7A is a view illustrating formation of a first antenna and a varying part according to an embodiment of the present disclosure.
Figure 7B:
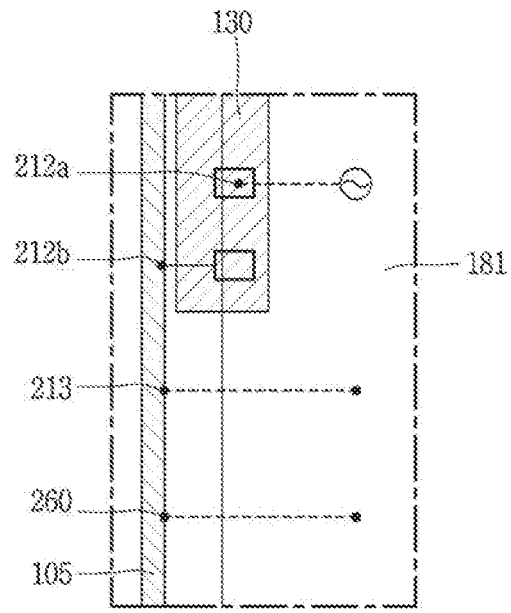
FIG. 7B is a schematic conceptual view of FIG. 7A.

FIG. 7A is a view illustrating formation of the first antenna 210 and the varying part 130 according to an embodiment of the present disclosure, and FIG. 7B is a schematic view of FIG. 7A. Referring to FIGS. 7A and 7B, the first antenna 210 includes the varying part 130. Although not illustrated in detail in an embodiment of the present disclosure, the varying part 130 is provided on the rear case 102 and formed between the first power feeder 212 and the first radiator 211 to vary a resonant frequency in a first frequency band. That is, in FIG. 7A, the rear case 102 is omitted. The varying part 130 is a part that mediates the first power feeder 212 and the first radiator 211 and may be used for tuning a resonance frequency. Hereinafter, the varying part 130 will be described in relation to the first antenna 210, but the present disclosure is not limited thereto, and the same description of the first antenna 210 may also be applied to the second and third antennas 220 and 230.

As described above, in an embodiment of the present disclosure, since antenna feeding is connected through the varying part 130, rather than directly connected to the metal members 105 and 106, a design freedom of the antenna may be increased. In addition, as described later, a plurality of contact pins 260 are used to improve grounding performance.

The first power feeder 212 has two power feeding terminals 212a and 212b which feed power to the first radiator 211 through the varying part 130. That is, in an embodiment of the present disclosure, the first power feeder 212 includes a first power feeding terminal formed on the PCB 181 and having a first power feeding terminal 212a electrically connected to one point of the varying part 130 and a second power feeding terminal 212b having one end electrically connected to the varying part 130 and the other end electrically connected to the first radiator 211.

A current supplied from the PCB 181 is supplied to the first radiator 211 sequentially through the first power feeding terminal 212a, the varying part 130, and the second power feeding terminal 212b in order.

FIGS. 18A to 18D illustrate examples of patterns of the varying part 130 according to an embodiment of the present disclosure. Hereinafter, the varying part 130 will be described with reference to FIGS. 18A to 18D.

Figure 18A:
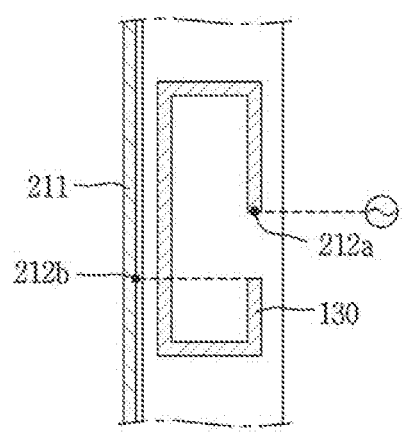
FIGS. 18A to 18D illustrate examples of patterns of a varying part according to an embodiment of the present disclosure.

The varying part 130 may be configured as a single member or as a plurality of members. FIGS. 18A and 18C illustrate that the varying part 130 is configured as a single member, and FIGS. 18B and 18D illustrate that the varying part is configured as two members.

As illustrated in FIG. 18A, in case where the varying part 130 includes one conductive member 130, the varying part 130 itself is a conductive member. The first power feeding terminal 212a is electrically connected to one end of the conductive member and the second power feeding terminal 212b is electrically connected to the other end of the conductive member to feed power to the first radiator 211. This is for adjusting an electrical length, and the conductive member here may be called a delay feeding line. Here, power may be directly fed from both ends of the conductive member to enable band width, impedance matching, and resonance frequency tuning of the antenna.

Figure 18B:
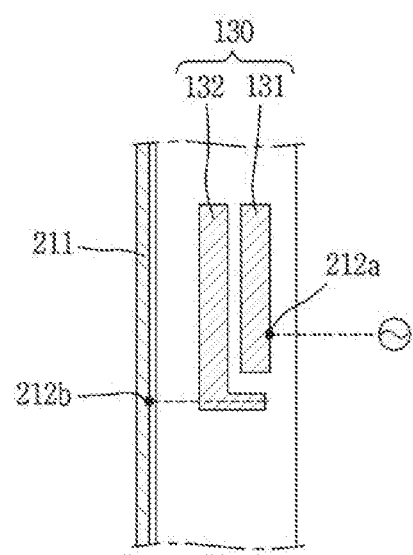
Figure 18C:
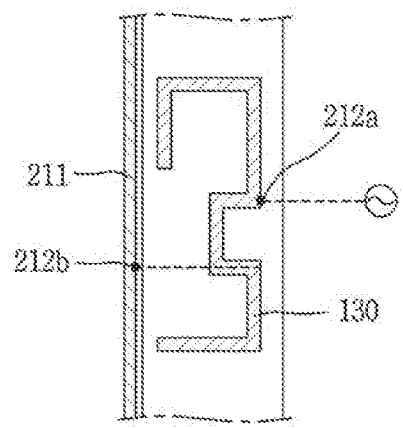
Figure 18D:
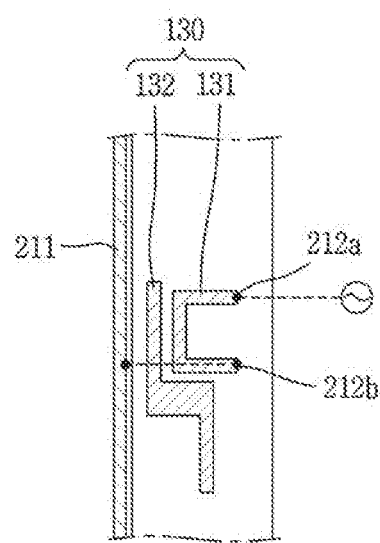

Also, as illustrated in FIG. 18B, in case where the varying part 130 includes two conductive members 131 and 132, a direct power feeding method and an indirect power feeding method may be performed at the same time. That is, when the varying part 130 is formed of the first and second conductive members 131 and 132, the second conductive member 131 is spaced apart from the first conductive member 131 fed from the first power feeding terminal 212a, and the second conductive member 132 is fed by a coupling feeding method or an indirect power feeding method between the first and second conductive members 131 and 132. Thereafter, the second conductive member 132 is brought into contact with the second power feeding terminal 212b, so that the second power feeding terminal 212b directly feeds power to the first radiator 211. This power feeding scheme may be called gap coupling feeding, which is a type of indirect power feeding scheme. As described above, the band width, impedance matching, and resonance frequency tuning of the antenna are possible by using direct power feeding and indirect power feeding methods in combination.

In case where the varying part 130 is formed of one conductive member, it is fed by the direct power feeding method. However, when the varying part 130 is formed of two or more conductive members, at least two conductive members may be spaced apart from each other and may be fed by the indirect power feeding method.

For example, when the varying part 130 is composed of three or more conductive members, the two conductive members may be formed in contact with the first and second power feeding terminals 212a and 212b, respectively, and the other remaining conductive members may be spaced apart from each other and indirectly fed to vary a frequency band.

Further, as illustrated in FIG. 18C, the first and second power feeding terminals 212a and 212b may be electrically connected to a middle point of the varying part 130, which is configured as a single conductive member. Here, since the conductive member implements an open stub type and is directly fed by a feeding line between the points where the first and second power feeding terminals 212a and 212b of the conductive member 130 are connected, the section may be called a feeding line. Here, in the other remaining region, an additional resonance frequency is formed through a stub pattern derived from the feeding line or a function for impedance matching is performed. That is, FIG. 18C shows a configuration formed by adding the open stub to the configuration of FIG. 18A.

Also, as illustrated in FIG. 18D, the varying part 130 includes the first and second conductive members 131 and 132, and one end of the first conductive member 131 is directly fed by the first power feeding terminal 212a and the other end thereof is directly fed with the first radiator 21 by the second power feeding terminal 212b, and thus, as illustrated in FIG. 18A, the first radiator 211 is directly fed by the first conductive member 131. Also, the second conductive member 132 is formed to be spaced apart from the first conductive member 131 and indirectly fed by the first conductive member 131. Since the second conductive member 132 is indirectly fed in an open stub form, the second conductive member 32 may be called a gap coupled open stub.

Here, the first and second conductive members 131 and 132 are fed by the indirect power feeding method to enable additional resonance frequency formation and impedance matching.

The metal members 105 and 106 are grounded by a plurality of contact pins 260, and the plurality of contact pins 260 are formed in a direction away from the first power feeder 212 based on the first grounding part 213 and spaced apart from each other by an interval smaller than ¼ times a wavelength ($\lambda_1$) corresponding to a first resonance frequency f1 as a center frequency of the first frequency band. The plurality of contact pins 260 are grounded to the PCB 181 or the frame 104, and different contact pins 260 may be used according to grounding methods. This is the same with the second and third antennas 220 and 230, and the contact pins 260 must be spaced apart from each other by an interval smaller than ¼ times wavelengths ($\lambda_2, \lambda_3$) corresponding to the second and third resonance frequencies f2 and f3 as center frequencies of the second and third frequency bands, respectively.

The contact pin 260 includes a first contact pin 261 electrically connecting the PCB 181 and the metal members 105 and 106 to ground the metal members 105 and 106 and a second contact pin 262 electrically connecting the frame 104 and the metal members 105 and 106 to ground the metal members 105 and 106.

FIG. 3 is a view illustrating an arrangement of a plurality of contact pins 260 according to an embodiment of the present disclosure. Referring to FIG. 3, the configuration of connecting (including power feeding and grounding) the first and second metal members 105 and 106, while contacting the first and second metal members 105 and 106 includes the first power feeder 212 in addition to the plurality of contact pins 260. Accordingly, the first power feeder 212 may also be included in the contact pin 260 in a broad sense. However, in an embodiment of the present disclosure, since the first power feeder 212 serves to feed power to the metal members to implement the first antenna 210 and the plurality of contact pins 260 serve to prevent parasitic resonance in the first to third antennas 210, 220, and 230, the first power feeder 212 and the plurality of contact pins 260 are distinguished from each other and, according to circumstances, the second power feeding terminal 212b of the first power feeder 212 will be described as being included in the contact pin 260. For example, a contact pin 261 illustrated in FIG. 9A may be the second power feeding terminal 212b.

For example, the first antenna 210 implements an antenna of a GPS band. Since a distance between the contact pins 260 is close to about one-quarter of a wavelength corresponding to a GPS operating frequency (157 MHz), generating parasitic resonance in a frequency near the GPS band to degrade antenna efficiency.

Figure 9A:
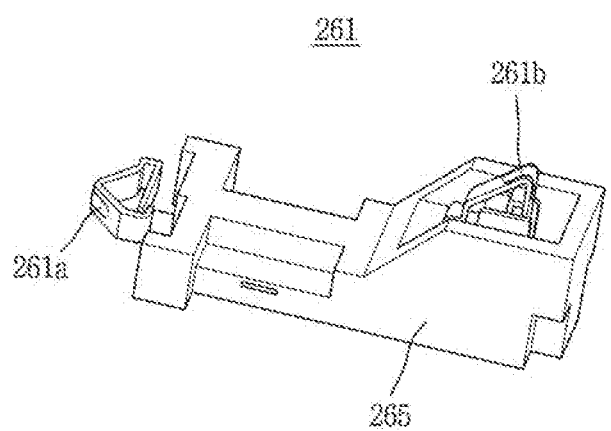
FIGS. 9A to 9C illustrate an embodiment of contact pins in an embodiment of the present disclosure.
Figure 9B:
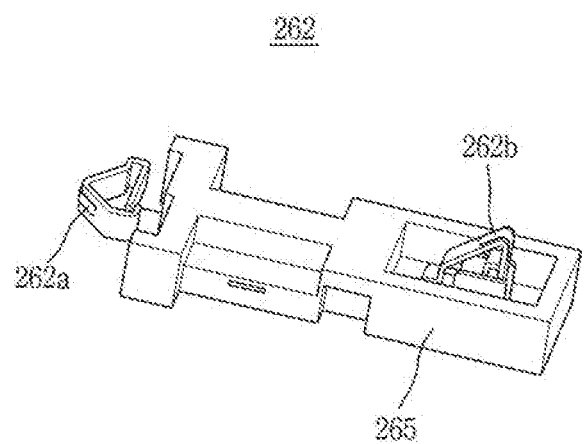
Figure 9C:
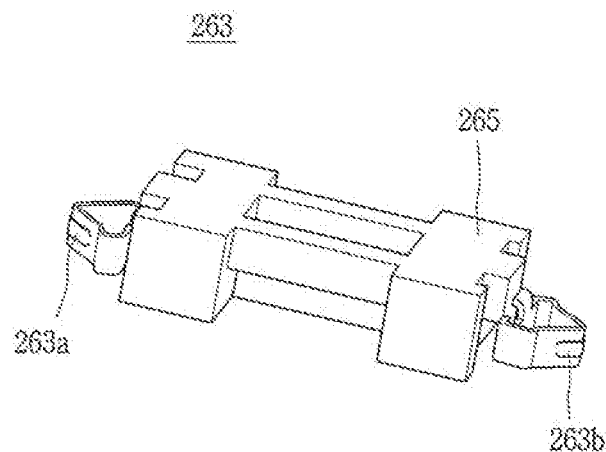
Figure 10A:
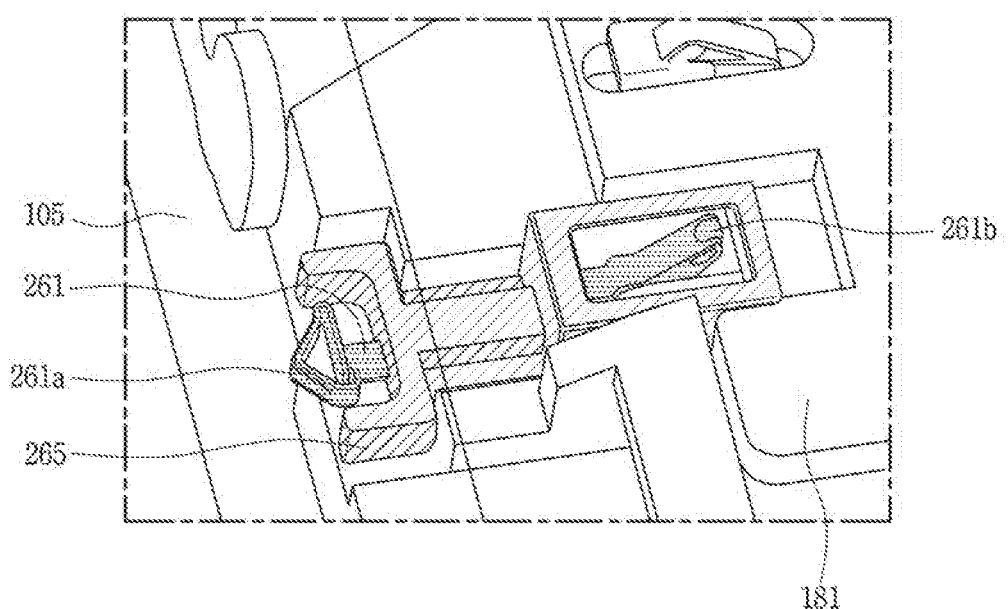
FIGS. 10A to 10C are schematic views illustrating grounding by a first contact pin according to an embodiment of the present disclosure.
Figure 10B:
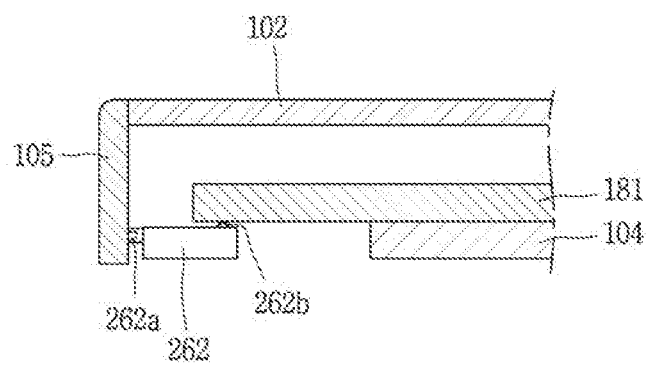
Figure 10C:
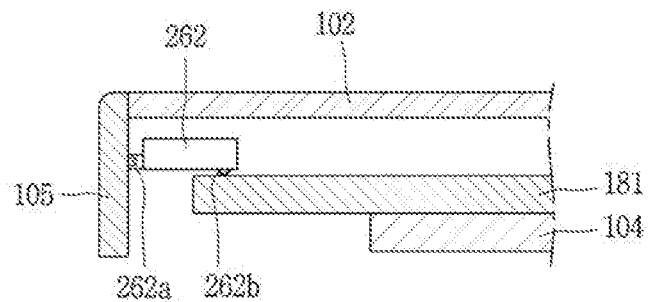
Figure 11A:
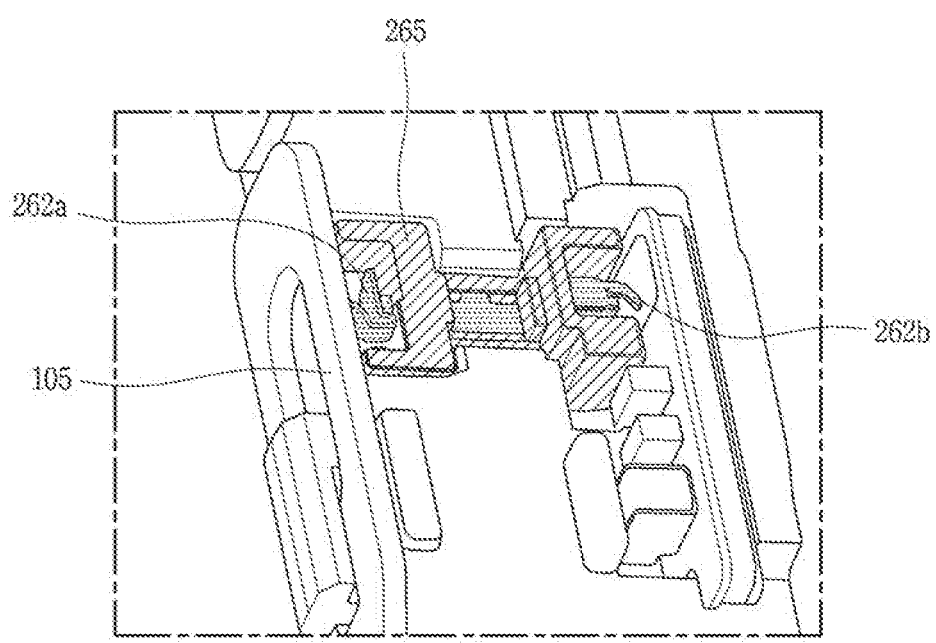
FIGS. 11A to 11C are schematic views illustrating grounding by a second contact pin according to an embodiment of the present disclosure.
Figure 11B:
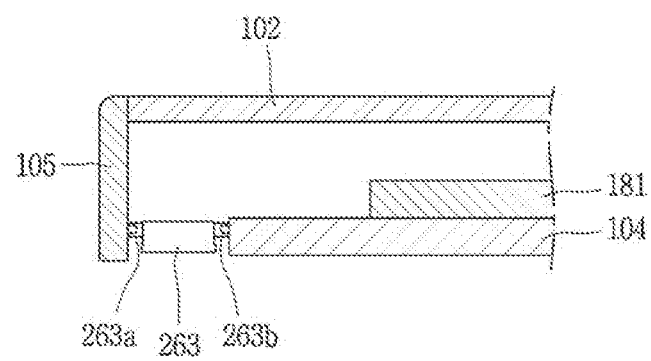
Figure 11C:
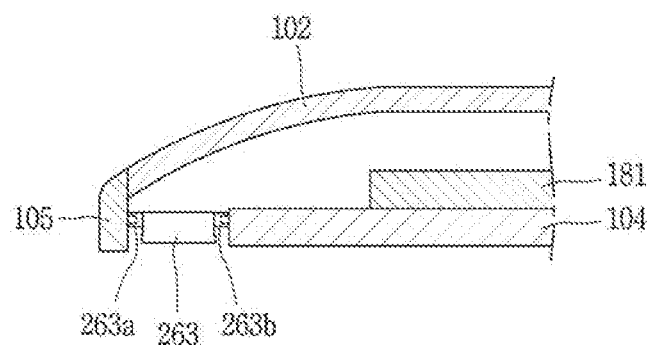

FIGS. 9A to 9C illustrate an embodiment of the contact pin 260 in an embodiment of the present disclosure, FIGS. 10A to 10C illustrate grounding by the first contact pin according to an embodiment of the present disclosure, and FIGS. 11A to 11C are schematic views illustrating grounding by the second contact pin according to the embodiment of the present disclosure.

Referring to FIGS. 9A to 11C, the contact pin 260 serves to connect the first and second metal members 105 and 106 to the PCB 181 or the frame 104. The contact pins 260 may be divided into vertical contact pins 261 and 262 and a linear contact pin 263 according to a structural shape to connect them. Here, the vertical contact pins 261 and 262 may be used as the second power feeding terminal 212b, and the linear contact pin 262 may be used as a first grounding part 213.

As illustrated in FIG. 10A, one end 260a and the other end 260b of the contact pin 260 may be formed of a metal wire of a bent terminal. The bent terminal may be elastically bent by a force within a certain range which acts in a direction opposite to a protruding direction. When the first radiator 211 presses one end 260a of the contact pin 260 or the PCB 181 presses the other end 260b of the contact pin 260, it may be compressed within a predetermined range to stably connect other members.

The contact pin 260 may include a mold portion 265 for coupling to the frame 104. A depression (or recess) may be formed in the frame 104 in a shape corresponding to an appearance of the mold portion 265, so that the contact pin 260 may be inserted. The mold portion 265 may be dual-injected to the metal wire or, after the metal wire is inserted into the mold portion 265, one end 260a and the other end 260b may be bent to form a final shape of the contact pin 260.

Among the vertical contact pints 261 and 262, the first vertical contact pin 261, having the molding portion 265 slightly higher, may be used to connect the two members through the frame 104, and the second vertical contact pin 262, not having a large molding portion 265, may be used to connect the two members without going through the frame 104. For example, the first vertical contact pin 261 may be a second power feeding terminal 212b, and the second vertical contact pin 262 may be the first grounding part 213.

Referring to FIGS. 10B and 10C, one end 262a of the second vertical contact pin 262 is in contact with the first metal member 105 and the other end 262b is in contact with the PCB 181. The frame 104 is provided on one surface (upper surface or lower surface) of the PCB 181, and the second vertical contact pin 262 is formed at the same height as the frame 104 and is in direct contact with the PCB 181 through a recess formed in the PCB 104.

That is, one end 262a of the second vertical contact pin 261 is in contact with the first metal member 105 and the other end 262b is bent substantially vertically from the one end 262a so as to be in contact with one surface of the PCB 181. The second contact pin 263 is horizontally formed so that one end portion 263a is in contact with the first metal member 105 and the other end portion 263b is in contact with the frame 104 to ground the first metal member 105.

In order for the other ends 261b and 262b of the first contact pins 261 and 262 to be in contact with the lower surface of the PCB 181, the other ends 261b and 262b must protrude more than the frame 104. FIG. 10C illustrates that the first contact pins 261 and 262 are grounded to an upper surface of the PCB 181. In the case of FIG. 10C, a thickness of the mobile terminal may be increased by the thickness of the first vertical contact pin 261, which is not desirable.

Also, FIG. 11A is a view illustrating that the second contact pin 263 is grounded to the frame 104, in which a recess is formed in the frame 104 so that the second contact pin 263 is inserted into the recess. FIG. 11B shows a case where the rear case 102 is flat, and FIG. 11C shows a case where the rear case 102 is curved. As illustrated in FIG. 11C, when the second contact pin 263 is used, the rear case 102 can be formed as a curved surface, which is advantageous for realizing a slim mobile terminal. Here, both ends 263a and 263b of the second contact pin 263 are connected to the first metal member 105 and the frame 104, respectively.

If a distance between the plurality of contact pins 260 is larger than ¼ times wavelengths $\lambda_1$, $\lambda_2$, and $\lambda_3$ corresponding to the first to third resonance frequencies f1, f2 and f3, parasitic resonance may occur.

FIG. 7A is a view illustrating power feeding and grounding of the metal member and the PCB 181 according to the embodiment of the present disclosure, and FIG. 7B is a conceptual view of FIG. 7A.

Referring to FIG. 7A, a fastening portion 107 coupled to the frame 104 is provided at an end of the first radiator 211, and an extending pattern portion 217 is formed at the fastening portion 107. A first resonance frequency may be realized using the first metal member 105, but in order to vary a bandwidth of the first resonance frequency and a resonance length, the extending pattern portion 217 is formed of a metal at the fastening portion 107 formed at the end of the first metal member 105. The extending pattern portion 217 may be, for example, a flexible circuit board. As illustrated in FIG. 7A, the first power feeder 212 includes first and second power feeding terminals 212a and 212b. When a current is supplied from the PCB 181 by the first power feeding terminal 212a, the supplied current flows to the first metal member 105 via the varying part 130 and the second power feeding terminal 212b. As illustrated in FIGS. 7A and 7B, the first radiator 211, the first power feeder 212, the first grounding part 213, and the contact pin 260 are formed to form the first antenna 210 and prevent parasitic resonance.

Figure 8:
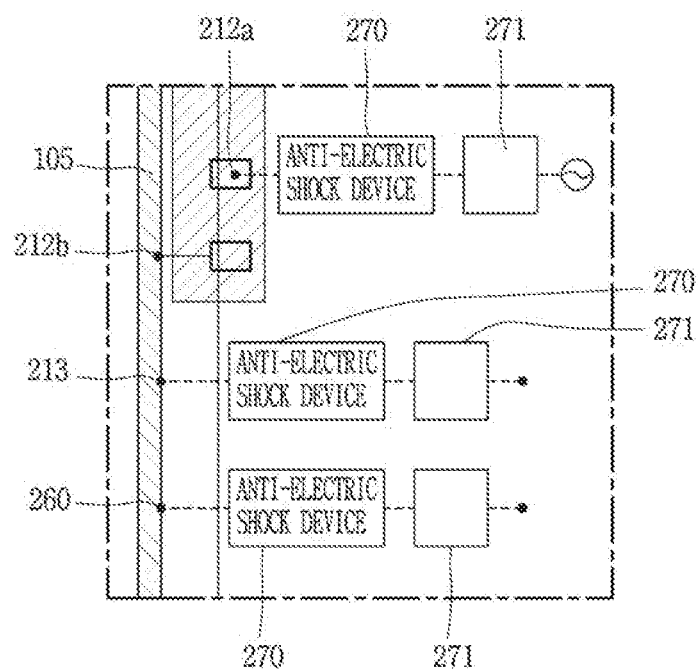
FIG. 8 is a conceptual view for preventing electric shock in a mobile terminal according to an embodiment of the present disclosure.

FIG. 8 is a conceptual view for preventing an electric shock in a mobile terminal according to an embodiment of the present disclosure. Since the first and second metal members 105 and 106 are exposed to the outside, a minute current may flow. In order to prevent this, an anti-electric shock device 270 may be connected to the first power feeder 212, the first grounding part 213, and the contact pin 260, and a matching portion 271 for tuning may be formed in the anti-electric shock device 270. The matching portion 271 includes a lumped element such as an inductor or a capacitor.

In an embodiment of the present disclosure, antennas may be formed at the upper and lower ends of the frame 104. An antenna provided at an upper end of the frame 104 may be referred to as a fourth antenna 240, and an antenna provided at the lower end of the frame 104 will be referred to as a fifth antenna 250.

The fourth and fifth antennas 240 and 250 according to an embodiment of the present disclosure may be provided in at least a partial region of the upper and lower ends of the frame 104. That is, the fourth and fifth antennas 240 and 250 may be provided only at the upper end of the frame 104, only at the lower end of the frame 104, or at both the upper end and the lower end, as necessary.

Figure 12:
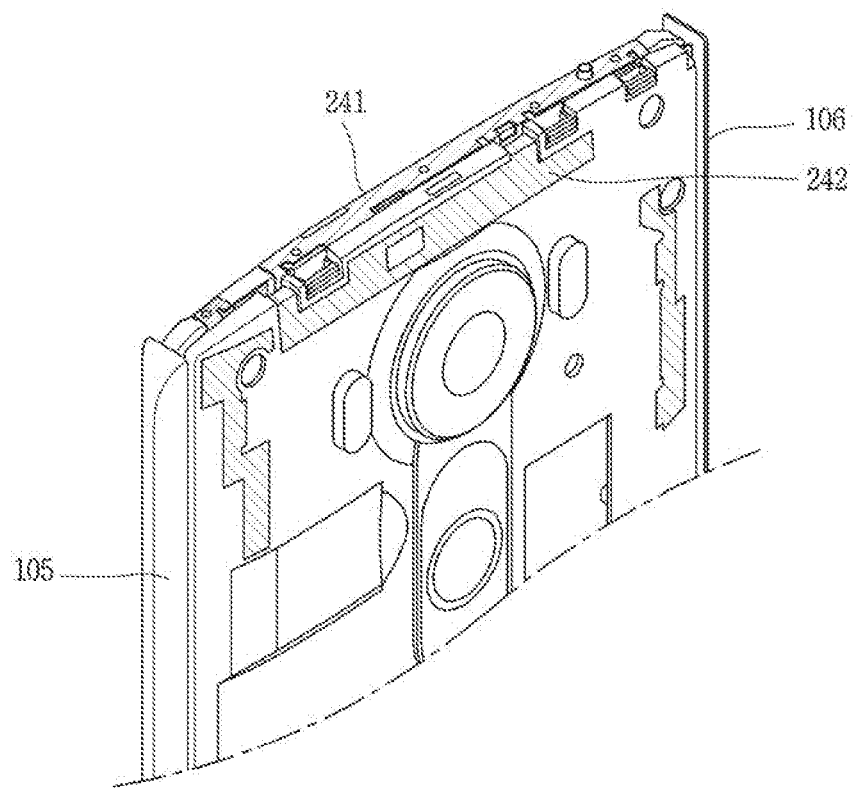
FIG. 12 is a perspective view of a mobile terminal illustrating a fourth antenna according to an embodiment of the present disclosure.
Figure 13:
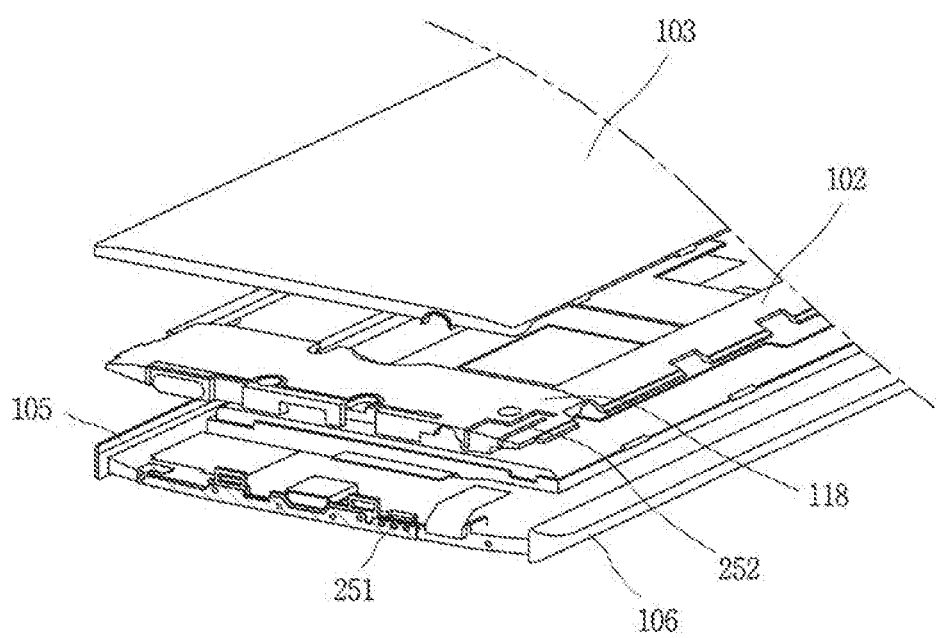
FIG. 13 is an exploded perspective view of a mobile terminal illustrating a fourth antenna according to an embodiment of the present disclosure.
Figure 14A:
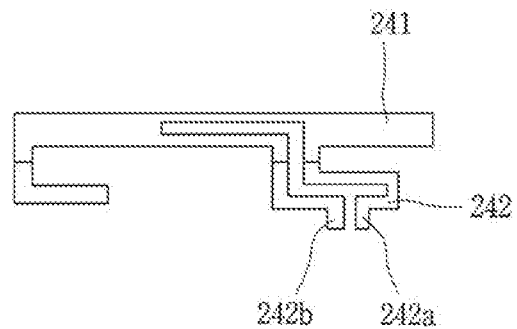
FIGS. 14A to 14C are views illustrating a process of forming a fourth antenna according to an embodiment of the present disclosure.
Figure 14B:
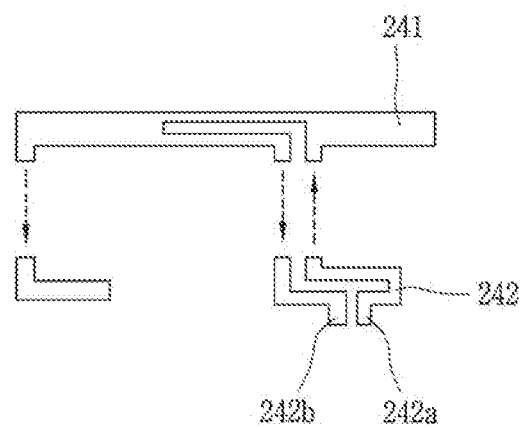
Figure 14C:
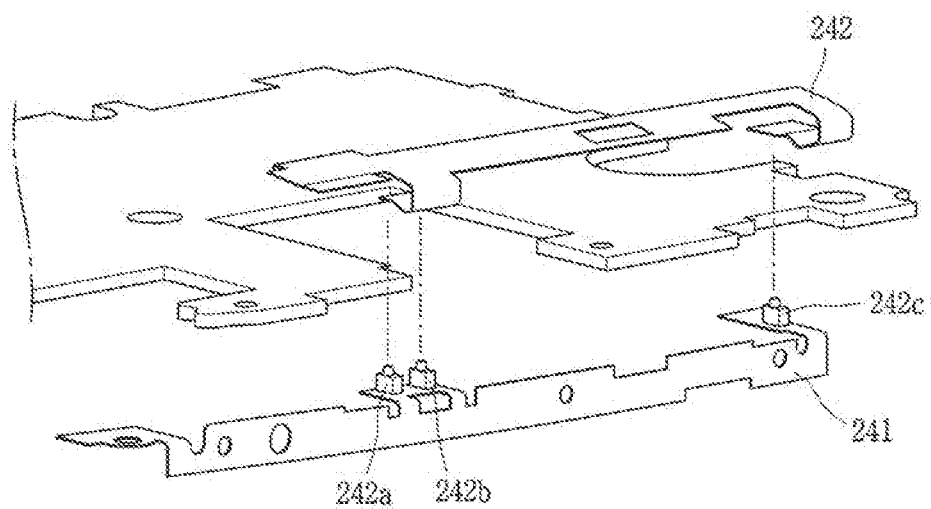

First, the fourth antenna 240 provided on the upper side of the frame 104 will be described. FIG. 12 is a perspective view of the mobile terminal illustrating a fourth antenna according to an embodiment of the present disclosure, FIG. 13 is an exploded perspective view of a mobile terminal illustrating a fourth antenna according to an embodiment of the present disclosure, and FIGS. 14A to 14C are views illustrating a process of forming a fourth antenna according to an embodiment of the present disclosure.

Hereinafter, description will be made with reference to FIGS. 12 to 14C.

First, the fourth antenna 240 will be described. The fourth antenna 240 includes a first pattern portion 241 formed on an upper end surface of the frame 104 and a second pattern portion 242 formed on the rear case 102. The first and second pattern portions 241 and 242 are electrically connected to each other and a fourth power feeder 244 and a fourth grounding part 245 are formed on any one of the first and second pattern portions 241 and 242.

The first and second pattern portions 241 and 242 are electrically connected by c-clips 242a, 242b, and 242c. The c-clip 242a performs a power feeding function, the c-clip 242b performs a grounding function, and the c-clip 242c simply performs an electrical connection function. The fastening portion 107 coupled to the frame 104 is provided at the upper end of the first radiator 211, and the first pattern portion 241 may be fastened to the fastening portion 107. As described above, according to the embodiment of the present disclosure, since the antenna pattern is implemented in a part of the upper end surface of the frame 104 and the rear case 102 to allow the two separated entities are brought into contact with each other, a degree of freedom of design of the antennas may be increased. That is, even when the metal material is used in a fixed form on the outer surface, a pattern may be formed on the rear case 102 to improve a bandwidth and efficiency of the antenna. Here, there is no particular limitation as long as it is a point-to-point contact structure, in addition to the c-clip.

The fifth antenna 250 includes a third pattern portion 251 provided below the frame 104 and formed on the lower end surface of the frame 104 and a fourth pattern portion 252 formed on the speaker module 118 formed on the speaker module 118 disposed on the same plane as the rear case 102. The third and fourth pattern portions 251 and 252 are electrically connected and a fifth feeder 254 and a fifth grounding part 255 are formed in any one of the third and fourth pattern portions 251 and 252.

Similarly, to the fourth antenna 240, in the fifth antenna 250, the third and fourth pattern portions 251 and 252 are electrically connected to each other by a C-clip in the fifth antenna 250. Although not illustrated in detail, the fastening portion 107 coupled to the frame 104 is provided at a lower end of the third radiator 231, and the third pattern portion 251 is fastened to the fastening portion 107. The fastening portion 107 has the same function as that in the first antenna 210.

Here, the first and second pattern portions 241 and 242 and the third and fourth pattern portions 251 and 252 may be connected to each other in at least two locations.

Meanwhile, in an embodiment of the present disclosure, the first antenna 210 implements a frequency of a GPS/high band region, the second antenna 220 implements a frequency of a Bluetooth/WiFi region, and the fourth antenna 240 implements a frequency of a low band/middle band region. That is, antennas of the low band (700-900 MHz) and the middle band (1700-2100 MHz) are arranged on the upper end surface of the frame 104 in which designing of an antenna pattern is relatively free, and in the case of the antenna of the GPS (1575 MHz) and the high band (HB) (2300-2700 MHz), since the GPS and the HB region are close to each other, a single antenna is preferably configured for the GPS and the HB.

Also, since the high band (2300-2700 MHz) overlaps the BT/WiFi 2.4 GHz band, the GPS/HB antenna and the BT/WiFi antenna are designed on the first and second metal members 105 and 106 formed on both sides to minimize interference between the antennas. In addition, in order to reduce frequency interference of the middle band which is a frequency between the GPS (1575 MHz) and the high band (2300-2700 MHz), the GPS/HB antenna is disposed in the metal member region far from the end of the middle band pattern. That is, when the low band is implemented on the left side of the fourth antenna 240 and the middle band is implemented on the right side, the first antenna 210 implementing the GPS/High band region is formed on the first metal member 105.

Hereinafter, performance and efficiency of an antenna according to an embodiment of the present disclosure will be described.

Figure 17A:
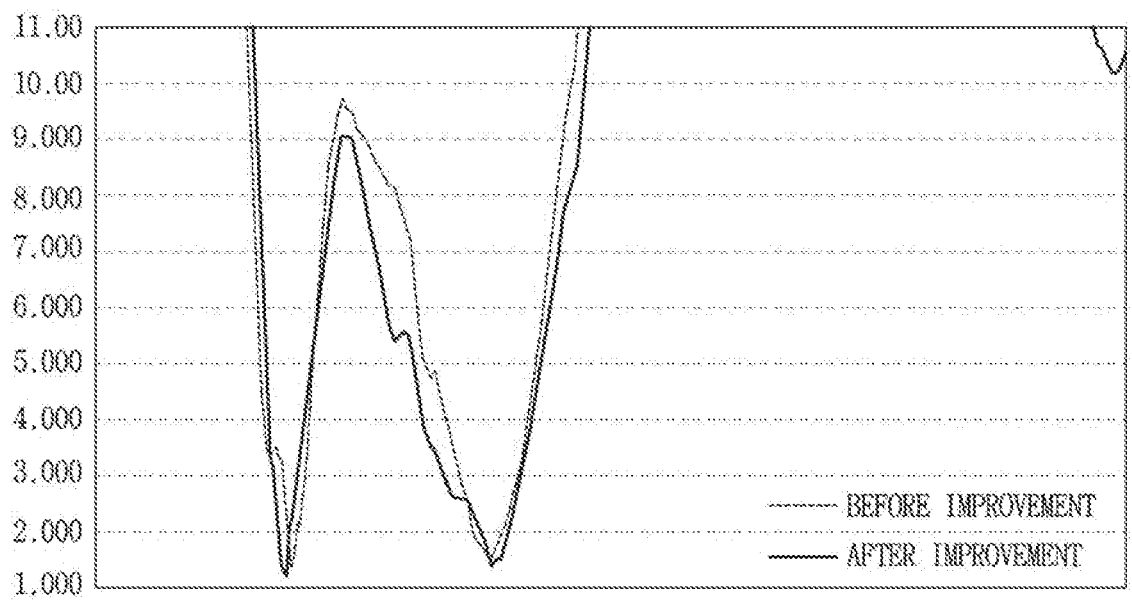
FIG. 17A is a graph illustrating antenna performance according to the presence or absence of parasitic resonance according to an embodiment of the present disclosure.
Figure 17B:
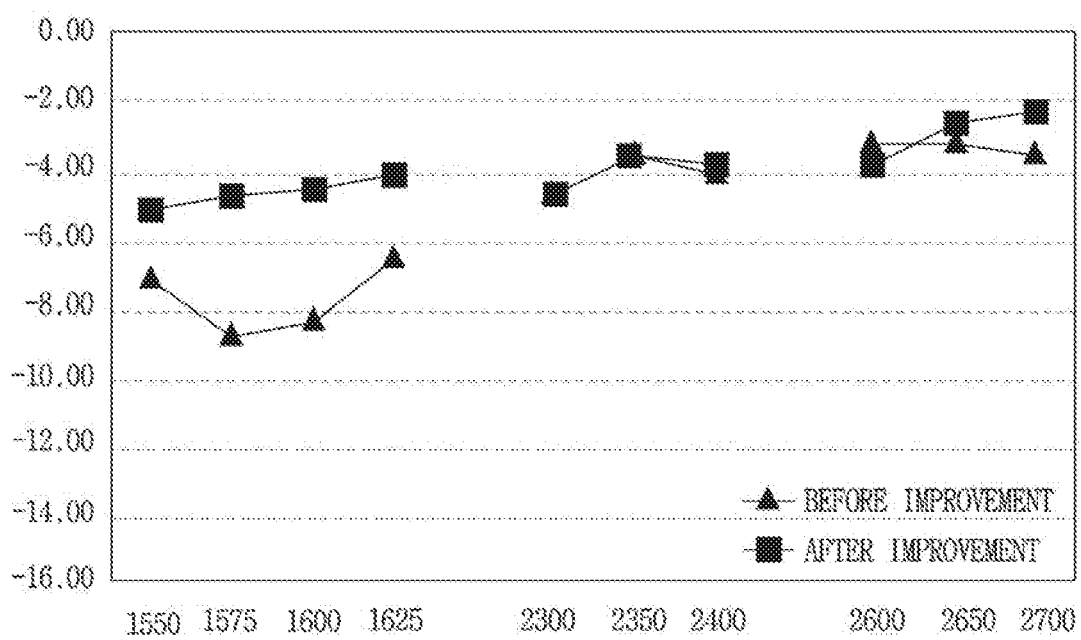
FIG. 17B is a graph illustrating antenna efficiency in FIG. 17A.

FIG. 17A is a graph illustrating antenna performance according to the presence or absence of parasitic resonance according to an embodiment of the present disclosure, and FIG. 17B is a graph illustrating antenna efficiency in FIG. 17A. Referring to FIGS. 17A and 17B, it can be seen that when parasitic resonance occurs at 1550-1625 MHz, antenna efficiency is low, but when the parasitic resonance is removed, the antenna efficiency is improved by about 2 dB. The parasitic resonance is expressed in a frequency form overlapping the first to third resonant frequencies in the first to third antennas 210, 220 and 230, and may be removed by grounding the first and second metal members 105 and 106 by the plurality of contact pins 260.

Figure 19A:
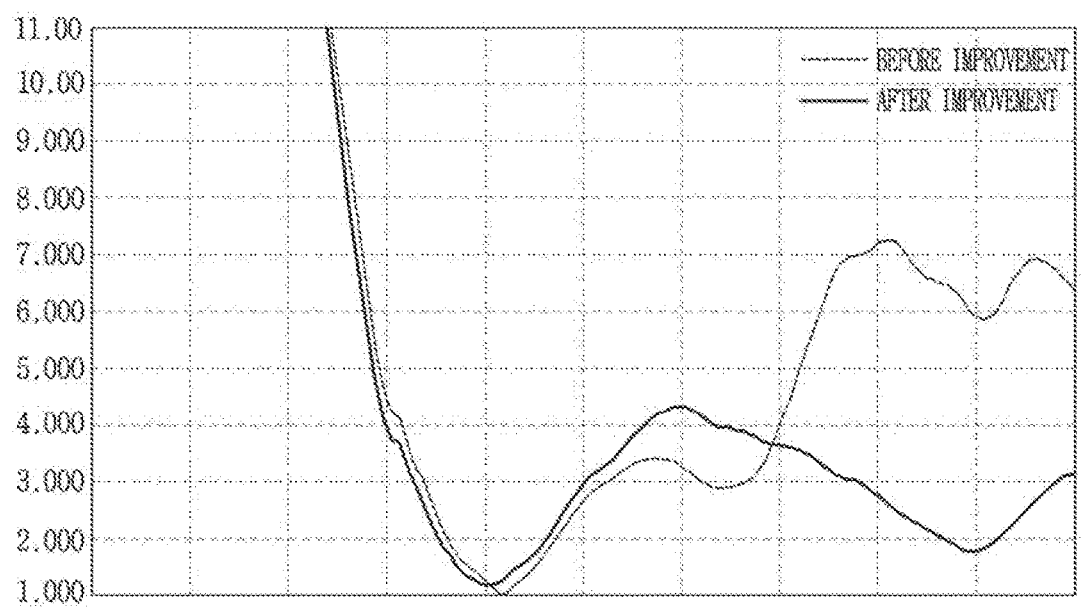
FIG. 19A is a graph illustrating antenna performance according to the presence or absence of an open stub in a varying part according to an embodiment of the present disclosure.
Figure 19B:
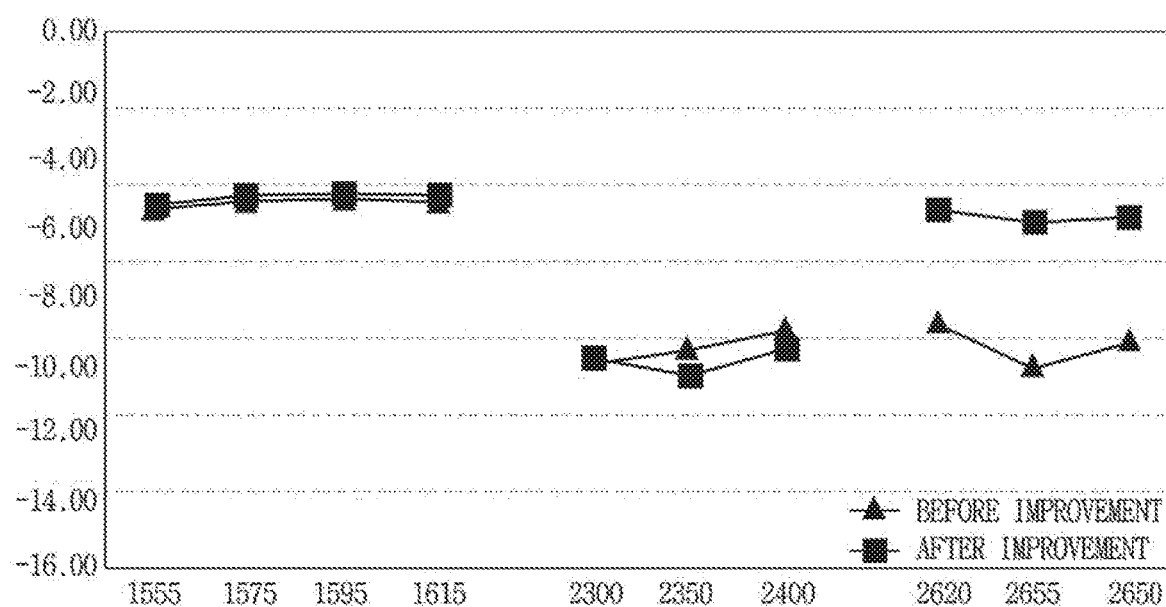
FIG. 19B is a graph illustrating antenna efficiency in FIG. 19A.

FIG. 19A is a graph illustrating antenna performance according to the presence or absence of an open stub in a varying part according to an embodiment of the present disclosure, and FIG. 19B is a graph illustrating antenna efficiency in FIG. 19A. That is, FIG. 19A is a graph of the antenna performance in the state as illustrated in FIG. 18C. Referring to FIGS. 19A and 19B, it can be seen that the antenna performance is improved when the open stub is added to the varying part 130. This is particularly remarkable at 2620-2650 MHz.

Figure 20:
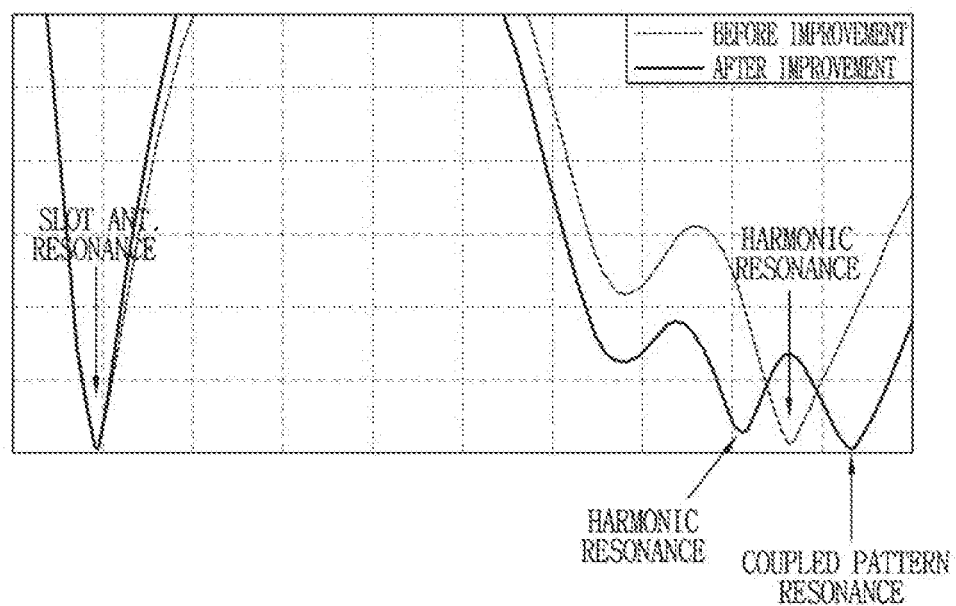
FIG. 20 is a graph illustrating antenna performance in case where gap-coupled stub is present in FIG. 18D.

FIG. 20 is a graph illustrating antenna performance when a gap-coupled stub is provided in FIG. 18D. As illustrated in FIG. 20, additional resonance is formed in the 5 GHz band by a coupled pattern to form dual resonance, thereby improving performance of the WiFi in the 5 GHz band. In addition, the frequency of the 5 GHz band may be controlled independently of the 2.4 GHz band, which is a resonance frequency band based on the slot antenna.

Figure 21A:
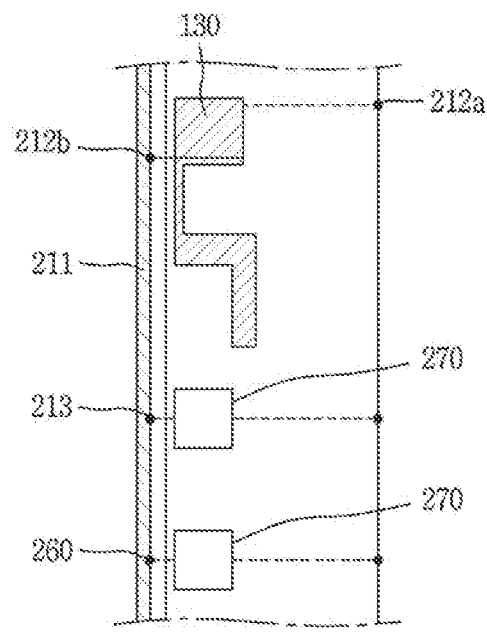
FIG. 21A is a conceptual view of a varying part having an anti-electric device according to an embodiment of the present disclosure.
Figure 21B:
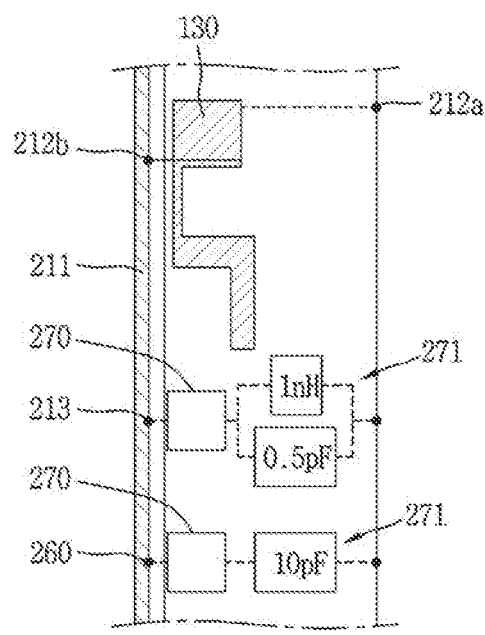
FIG. 21B is a conceptual view of a varying part in case where a matching portion is formed in the anti-electric shock device according to an embodiment of the present disclosure.
Figure 21C:
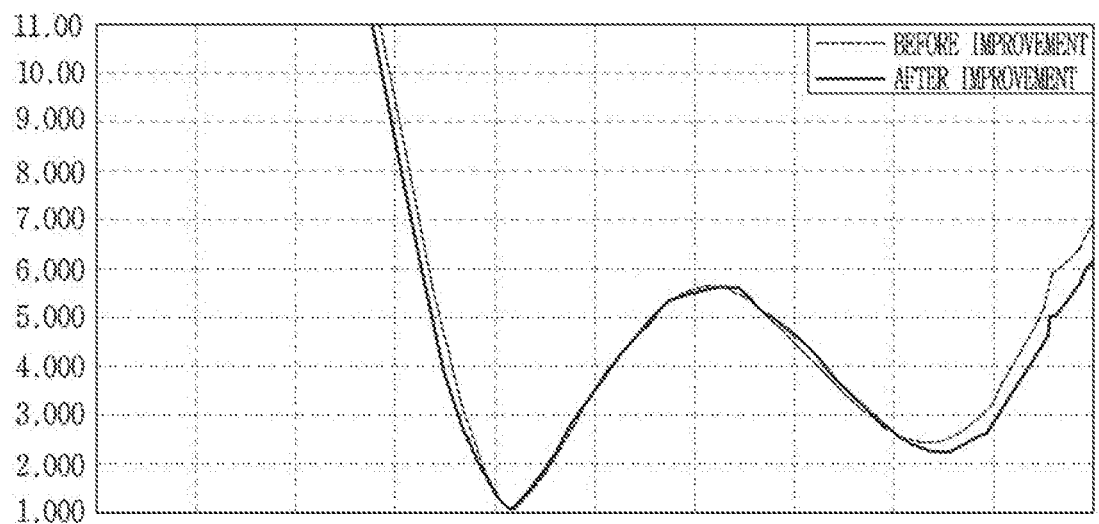
FIG. 21C is a graph illustrating antenna performance according to the presence or absence of the matching portion 271.
Figure 21D:
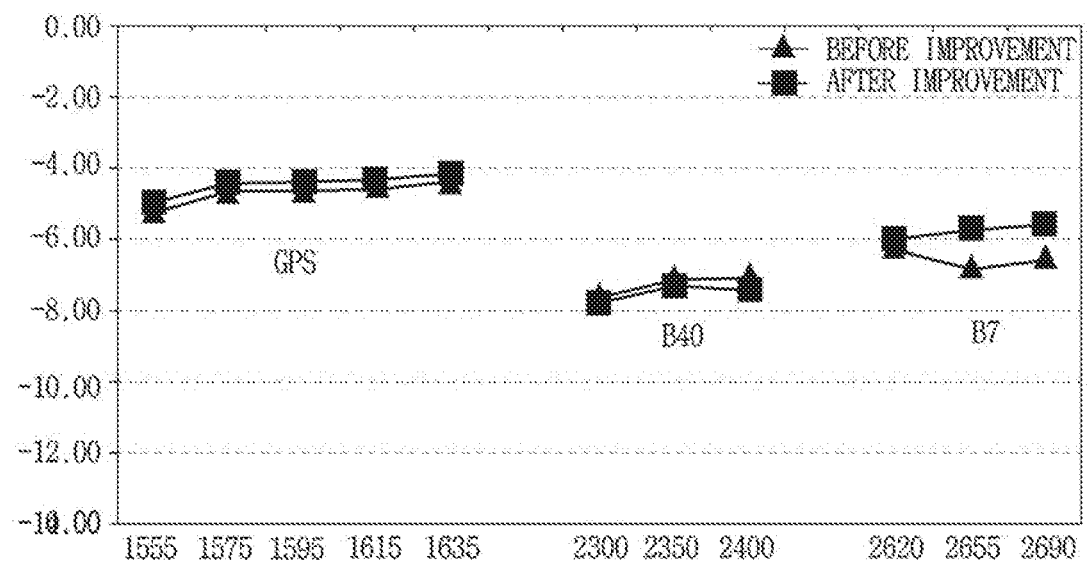
FIG. 21D is a graph illustrating antenna efficiency depending on the presence or absence of the matching portion.

FIG. 21A is a conceptual view of a varying part having the anti-electric shock device 270 according to an embodiment of the present disclosure, FIG. 21B is a conceptual view illustrating a varying part when the matching portion 271 is provided in the anti-electric shock device 270 according to an embodiment of the present disclosure, FIG. 21C is a graph illustrating antenna performance according to the presence or absence of the matching portion 271, and FIG. 21D is a graph illustrating antenna efficiency according to the presence or absence of the matching portion 271.

As illustrated in FIGS. 21C and 21D, it can be seen that, when the matching portion 271 is present, antenna efficiency is improved through impedance matching at a high band frequency. Here, the anti-shock device 270 may be a capacitor and the matching portion 271 may be a combination of an inductor or a capacitor.

As illustrated in FIG. 21D, it can be seen that performance is improved particularly in the 2620-2690 MHz section.

The present invention described above may be implemented as a computer-readable code in a medium in which a program is recorded. The computer-readable medium includes any type of recording device in which data that can be read by a computer system is stored. The computer-readable medium may be, for example, a hard disk drive (HDD), a solid-state disk (SSD), a silicon disk drive (SDD), a ROM, a RAM, a CD-ROM, a magnetic tape, a floppy disk, an optical data storage device, and the like. The computer-readable medium also includes implementations in the form of carrier waves (e.g., transmission via the Internet). Also, the computer may include the controller 180 of the terminal. Thus, the foregoing detailed description should not be interpreted limitedly in every aspect and should be considered to be illustrative. The scope of the present invention should be determined by reasonable interpretations of the attached claims and every modification within the equivalent range are included in the scope of the present invention.

Embodiments of the present disclosure may be applied to a mobile terminal that utilizes a metal member provided on a side outer surface as a radiator of an antenna.

The invention claimed is:

1. A mobile terminal comprising:
a display unit;
a frame supporting the display unit;
a printed circuit board (PCB) formed on one surface of the frame;
a case formed on one surface of the PCB, first and second metal members disposed to be spaced apart from the frame on both sides of the frame, having a beam shape, and exposed to the outside; and
a first antenna formed to be adjacent to the frame and implementing a first frequency band,
wherein the first antenna includes:
a first radiator including at least one end of the first metal member or the second metal member;
a first power feeder feeding power to the first radiator; and
a first grounding part grounding the first radiator,
wherein the first or second metal member is grounded by a plurality of contact pins, and
wherein the plurality of contact pins are formed in a direction away from the first power feeder based on the first grounding part and are spaced apart from each other.

2. The mobile terminal of claim 1, wherein the first antenna further includes:
a varying part provided on the case, formed between the first power feeder and the first radiator, and varying a resonance frequency in the first frequency band.

3. The mobile terminal of claim 2, wherein the first power feeder includes:
a first power feeding terminal formed on the PCB and electrically connected to one point of the varying part; and
a second power feeding terminal electrically connected to the varying part at one end and electrically connected to the first radiator at the other end.

4. The mobile terminal of claim 3, wherein the varying part includes at least one conductive member, and when the conductive member is two or more, the conductive members are spaced apart from each other and fed through an indirect power feeding scheme.

5. The mobile terminal of claim 4, wherein the conductive member includes an open stub which is directly fed or indirectly fed.

6. The mobile terminal of claim 1, wherein the plurality of contact pins are spaced apart from each other at an interval smaller than ¼ times a wavelength ($\lambda 1$) corresponding to a center frequency (f1) of the first frequency band.

7. The mobile terminal of claim 6, wherein the plurality of contact pins includes a first contact pin electrically connecting the first or second metal member to the PCB.

8. The mobile terminal of claim 7, wherein the first contact pin is in contact with an upper surface or a lower surface of the PCB.

9. The mobile terminal of claim 8, wherein when the first contact pin is in contact with the lower surface of the PCB, a portion of the frame is cut away such that the PCB protrudes outwards, relative to the frame.

10. The mobile terminal of claim 6, wherein the plurality of contact pins includes a second contact pin electrically connecting the first or second metal member to the frame.

11. The mobile terminal of claim 6, wherein an anti-electric shock device is connected to at least one of the first power feeder, the first grounding part, or the plurality of contact pins.

12. The mobile terminal of claim 1, wherein a fastening portion coupled to the frame is provided at an end of the first radiator, and an extending pattern portion is formed in the fastening portion.

13. The mobile terminal of claim 1, wherein
the first antenna is formed at an upper end of the first metal member,
a second antenna implementing a second frequency band different from the frequency band of the first antenna is provided at an upper end of the second metal member, and
the second antenna includes:
a second radiator including an upper end of the second metal member and implementing the second frequency band;

a second power feeder feeding power to the second radiator; and a second grounding part grounding the second radiator.

14. The mobile terminal of claim 13, wherein the second metal member is grounded by a plurality of contact pins that are formed in a direction away from the second power feeder based on the second grounding part and that are spaced apart from each other at an interval smaller than ¼ times a wavelength ($\lambda 2$) corresponding to a center frequency (f2) of the second frequency band.

15. The mobile terminal of claim 13, wherein a third antenna implementing a third frequency band is provided at a lower end of the second metal member, and the third antenna includes:

a third radiator including the lower end of the second metal member and implementing a third frequency band;

a third power feeder feeding power to the third radiator; and a third grounding part grounding the third radiator.

16. The mobile terminal of claim 15, wherein the second metal member is grounded by a plurality of contact pins that are formed in a direction away from the third power feeder based on the third grounding part and that are spaced apart from each other at an interval smaller than ¼ times a wavelength ($\lambda 3$) corresponding to a center frequency (f2) of the third frequency band.

17. The mobile terminal of claim 15, wherein the third antenna further includes:

a varying part provided on the case, formed between the third power feeder and the third radiator, and varying a resonance frequency in a third frequency band.

18. The mobile terminal of claim 13, wherein the second antenna further includes:

a varying part provided on the case, formed between the second power feeder and the second radiator, and varying a resonance frequency in a second frequency band.

19. The mobile terminal of claim 1, further comprising:

a fourth antenna provided on an upper side of the frame, wherein the fourth antenna includes:

a first pattern portion formed on an upper end surface of the frame; and a second pattern portion formed on the case, wherein the first and second pattern portions are electrically connected and a fourth power feeder and a fourth grounding part are formed on the first and second pattern portions.

20. The mobile terminal of claim 1, further comprising:

a fifth antenna provided on a lower side of the frame, wherein the fifth antenna includes:

a third pattern portion formed on a lower end surface of the frame; and a fourth pattern portion formed on a speaker module disposed on the same plane as the case, wherein the third and fourth pattern portions are electrically connected and a fifth feeder and a fifth grounding part are formed on the third and fourth pattern portions.

* * * * *